US008803782B2

(12) United States Patent
Ochiai et al.

(10) Patent No.: US 8,803,782 B2
(45) Date of Patent: Aug. 12, 2014

(54) BIDIRECTIONAL SHIFT REGISTER AND IMAGE DISPLAY DEVICE USING THE SAME

(75) Inventors: Takahiro Ochiai, Chiba (JP); Mitsuru Goto, Chiba (JP); Hiroko Sehata, Sapporo (JP); Hiroyuki Higashijima, Konusu (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 413 days.

(21) Appl. No.: 13/164,811

(22) Filed: Jun. 21, 2011

(65) Prior Publication Data

US 2011/0310074 A1 Dec. 22, 2011

(30) Foreign Application Priority Data

Jun. 22, 2010 (JP) .................................. 2010-141990

(51) Int. Cl.
  *G09G 3/34* (2006.01)
(52) U.S. Cl.
  USPC ............. 345/100; 345/559; 345/98; 345/204; 345/208; 345/212; 377/69; 377/70; 377/73; 377/75; 377/64
(58) Field of Classification Search
  CPC . G09G 3/3648; G09G 3/3614; G09G 3/3677; G09G 2310/066; G09G 3/344; G09G 2300/0426; G09G 2330/021; G09G 3/3688; G09G 2310/08; G09G 3/003; G09G 3/2927; G09G 3/296; G09G 2300/0876; G09G 2310/0286; G09G 3/36
  USPC ............. 345/208, 100, 69, 78, 204, 212, 559; 377/64, 70, 73, 75
  See application file for complete search history.

(56) References Cited

U.S. PATENT DOCUMENTS

| 5,859,630 | A | * | 1/1999 | Huq | ............................... | 345/100 |
| 8,264,443 | B2 | * | 9/2012 | Lee et al. | ...................... | 345/100 |
| 8,421,736 | B2 | * | 4/2013 | Park | ............................... | 345/100 |
| 2003/0227433 | A1 | | 12/2003 | Moon | | |
| 2004/0150610 | A1 | * | 8/2004 | Zebedee et al. | ................ | 345/100 |
| 2006/0256066 | A1 | * | 11/2006 | Moon | ............................ | 345/100 |
| 2010/0150302 | A1 | | 6/2010 | Tsai et al. | | |

FOREIGN PATENT DOCUMENTS

| JP | 2004-157508 | 6/2004 |
| JP | 2009-33416 | 2/2009 |
| JP | 2009-272037 | 11/2009 |
| JP | 2010-192019 | 9/2010 |

OTHER PUBLICATIONS

JP Office Action for Japanese Patent Application No. 2010-141990, issued on Jan. 28, 2014.

* cited by examiner

*Primary Examiner* — Olga Merkoulova
(74) *Attorney, Agent, or Firm* — Antonelli, Terry, Stout & Kraus, LLP.

(57) ABSTRACT

A bidirectional shift register outputs pulses from a plurality of cascaded unit register circuits in a shift order which is one of a forward direction and a reverse direction. A λth stage of unit register circuit (38) has two set terminals connected to respective outputs of (λ−1)th and (λ+1)th stages and two reset terminals connected to respective outputs of (λ+2)th and (λ−2)th stages. The unit register circuit (38) sets, when a pulse is input to any one of the set terminals, a reference point N1 to an H level, and, when a pulse is input to any one of the reset terminals, N1 to an L level. The order of phase change of clock signals is reversed according to the direction of a shift, and whether a start trigger signal is applied to a top stage or a bottom stage is switched.

5 Claims, 15 Drawing Sheets

_US 8,803,782 B2_

BIDIRECTIONAL SHIFT REGISTER AND IMAGE DISPLAY DEVICE USING THE SAME

CROSS-REFERENCE TO RELATED APPLICATION

The present application claims priority from Japanese application JP 2010-141990 filed on Jun. 22, 2010, the content of which is hereby incorporated by reference into this application.

BACKGROUND OF THE INVENTION

1. Field of the Invention

The present invention relates to a bidirectional shift register which can switch the order of output of pulses and an image display device which uses the bidirectional shift register to drive the respective scanning lines.

2. Description of the Related Art

Higher resolution of a liquid crystal display device is materialized by improving the arrangement density of pixels in a display portion thereof. As the arrangement density is improved, the arrangement pitch of various kinds of signal lines for supplying signals to pixel circuits becomes finer. Gate lines provided correspondingly to scanning lines of pixels are connected to gate line driving circuits on sides of a display region. A gate line driving circuit includes a shift register for outputting to the respective scanning lines in sequence a voltage which enables writing data to a pixel circuit. As the resolution becomes higher, unit register circuits included in the respective stages of the shift register are also required to be reduced in size.

Ordinarily, a voltage is applied to gate lines in a top to bottom order of an image correspondingly to an order of input of image data in a vertical scanning direction. If the shift register may be driven bidirectionally, input image data may be written to pixel circuits in a bottom to top order when the scan line goes from the bottom to the top. This enables change in the direction of a displayed image with a mechanism that is simpler than that in a structure in which a frame memory for buffering image data or the like is provided and the order of the image data is changed thereby.

A shift register used in a gate line driving circuit or the like includes cascaded unit register circuits in a plurality of stages. Basically, operation in which the respective unit register circuits in the respective stages output a pulse once in an order from one end to the other end of the row of the unit register circuits is performed, the operation being linked with vertical scanning or the like.

FIG. 14 is a circuit diagram illustrating a basic structure of a unit register circuit (see Japanese Patent Application Laid-open Nos. 2004-157508 and 2009-272037). In a unit register circuit in an n-th stage, an output transistor M1 is connected between an output terminal (GOUT[n]) and a clock signal source CK, while a transistor M2 is connected between the terminal (GOUT[n]) and a power supply VOFF. FIG. 15 is a signal waveform chart illustrating operation of the unit register circuit illustrated in FIG. 14. When an output pulse GOUT[n−1] in the previous stage is input to the unit register circuit, a node N3 (one end of a capacitor C) connected to a gate of M1 is connected to a power supply VON, and a potential of the node N3 is pulled up to a High (H) level which is a potential at which the transistor is turned on. When the node N3 is at the H level, a node N4 is connected to the power supply VOFF to be set to a Low (L) level which is a potential at which the transistor is turned off, thereby turning off the transistor M2. In this way, the unit register circuit is in a set state. In this state, when a clock signal CKV (CK) transitions from the L level to the H level, the potential of the node N3 is further pulled up via the capacitor C connected between the gate and a source of the output transistor M1, and the clock signal CKV at the H level is output from the terminal GOUT [n].

On the other hand, in the case of transition of the clock signal CKV from the H level to the L level, the potential of the node N3 is pulled down and a voltage at the output terminal GOUT[n] is also pulled down. Here, linked with a rising edge of a clock signal CKB to an (n+1)th stage, a pulse is generated in an output signal GOUT[n+1] in the subsequent stage, which is input to the unit register circuit in the n-th stage. The pulse of GOUT[n+1] pulls down the potential of the node N3. This pulls up a potential of the node N4, the transistor M2 is turned on, and the output terminal is connected to the power supply VOFF. By the operation, a pulse of the output signal GOUT[n] is output.

SUMMARY OF THE INVENTION

In order to materialize bidirectional drive, both a structure used when the drive is in a forward direction and a structure used when the drive is in a reverse direction are provided in the unit register circuit, and a switch element for switching the directions is built in the unit register circuit. However, a bidirectional shift register which adopts such a unit register circuit has problems that miniaturization thereof is difficult and that it is not suitable for higher resolution of an image display device.

Further, at the timing at which an output pulse ends in each of the stages, the potential of the node N3 is abruptly pulled down from a potential higher than the H level to the L level, and the transistor M2 is turned on. Such operation is liable to cause unstable behavior at that timing unless timings and waveforms of signals relating to the operation are controlled accurately. For example, there is a problem that the transistor M2 may begin to be turned on before the output transistor M1 is completely turned off, which causes a through current to flow from the power supply VON to the power supply VOFF.

The present invention has been made to solve the above-mentioned problems, and an object of the present invention is to provide a bidirectional shift register which may perform stable bidirectional shift operation with a simple circuit structure and an image display device using the bidirectional shift register.

A bidirectional shift register according to an aspect of the present invention includes a shift register portion including unit register circuits cascaded in m stages, where m is an integer which is equal to or larger than 3, each of the stages being driven in sequence in synchronization with n-phase clock pulses applied according to an order of the cascade, where n is an integer which is equal to or larger than 3. The unit register circuit in a k-th stage, where k is an integer which satisfies 1≤k≤m, includes an output circuit for outputting an output pulse $P_k$ in synchronization with the n-phase clock pulse which is input to the unit register circuit with a reference point of the unit register circuit being at a first potential, a set circuit for setting the potential of the reference point to the first potential when a set signal is input, and a reset circuit for setting the potential of the reference point to a second potential when a reset signal is input. The unit register circuit in the k-th stage, where k is an integer which satisfies 1≤k≤m, further includes, as input terminals of the set signal, a forward direction set terminal to which the output pulse $P_{k-\alpha f}$, where k>αf, is input and a reverse direction set terminal to which the output pulse $P_{k+\alpha b}$, where k≤m−αb, is input, and, as input terminals of the reset signal, a forward direction reset terminal to which the output pulse $P_{k+\beta f}$, where $k \leq m-\beta f$, is input and a reverse direction reset terminal to which the output pulse $P_{k-\beta b}$, where $k>\beta b$ is input, provided that $\alpha f$, $\alpha b$, $\beta f$, and $\beta b$ are natural numbers which satisfy both $\alpha f<\beta b<n$ and $\alpha b<\beta f<n$.

The bidirectional shift register according to the one aspect of the present invention may be structured to further include: a clock signal generating portion; and a trigger signal generating portion, in which: the shift register portion outputs the output pulse $P_k$ in a shift order which is one of a forward direction and a reverse direction. In this structure, the clock signal generating portion supplies the n-phase clock pulses to the respective stages of the shift register portion in sequence in the forward direction in forward shift operation of the shift register portion and in the reverse direction in backward shift operation. The trigger signal generating portion generates a forward direction trigger signal at the start of the forward shift operation and generates a reverse direction trigger signal at the start of the backward shift operation. The forward direction trigger signal is input to the forward direction set terminal in each of first to $\alpha f$-th stages as the set signal. The reverse direction trigger signal is input to the reverse direction set terminal in each of $(m-\alpha b)$th to m-th stages as the set signal.

According to the present invention, there is provided an image display device including: a plurality of pixel circuits arranged in matrix correspondingly to a plurality of scanning lines; a plurality of gate signal lines provided for the plurality of scanning lines, respectively, for supplying a gate signal for controlling writing of image data to the plurality of pixel circuits; and a gate signal line driving circuit for, using the above-mentioned bidirectional shift register according to the present invention, generating the gate signal to each of the plurality of gate signal lines based on the output pulse which is output from a stage correlated with the gate signal line among the plurality of stages of the shift register portion.

According to the present invention, there may be obtained a bidirectional shift register which may perform stable bidirectional shift operation with a simple circuit structure and an image display device using the bidirectional shift register.

DETAILED DESCRIPTION OF THE INVENTION

Hereinafter, embodiments of the present invention (hereinafter simply referred to as embodiments) are described with reference to the attached drawings.

[First Embodiment]

Figure 1:
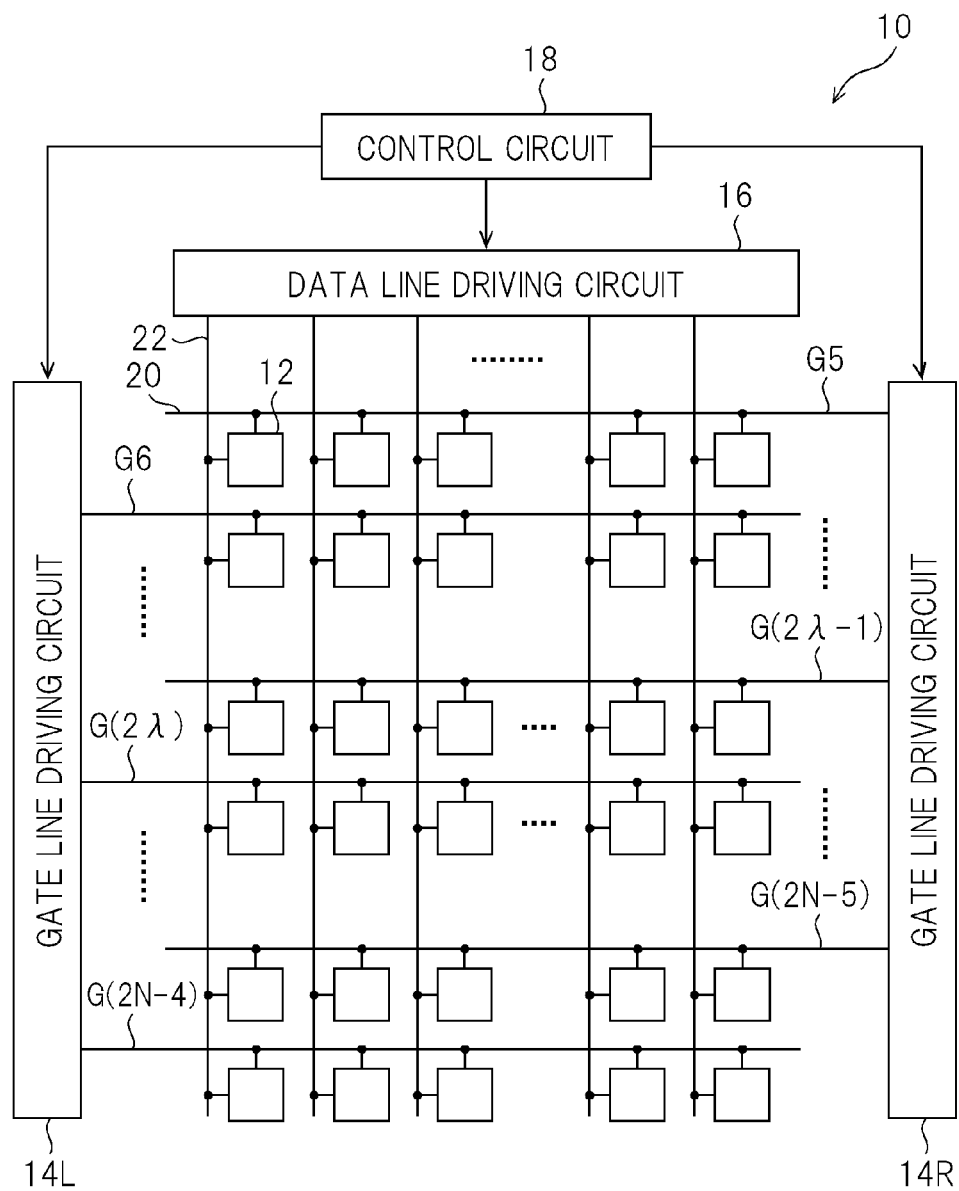
FIG. 1 is a schematic diagram illustrating a structure of an image display device according to a first embodiment.

FIG. 1 is a schematic diagram illustrating a structure of an image display device 10 according to a first embodiment. The image display device 10 is, for example, a liquid crystal display. The image display device 10 includes a plurality of pixel circuits 12, gate line driving circuits 14, a data line driving circuit 16, and a control circuit 18.

The pixel circuits 12 are arranged in a display portion in matrix so as to correspond to pixels.

A plurality of gate signal lines 20 arranged in a vertical direction (column direction) are connected to the gate line driving circuits 14. Each of the gate signal lines 20 is connected to a plurality of pixel circuits 12 arranged in a horizontal direction (row direction). The gate line driving circuits 14 output a gate signal to the plurality of gate signal lines 20 in sequence to render pixel circuits 12 connected to the gate signal lines 20 data writable.

A plurality of data lines 22 arranged in the horizontal direction are connected to the data line driving circuit 16. Each of the data lines 22 is connected to a plurality of pixel circuits 12 arranged in the vertical direction. The data line driving circuit 16 generates, from image data corresponding to one scanning line, signals corresponding to a plurality of pixels forming the scanning line and outputs the signals to the plurality of data lines 22. The pixel signals which are output to the respective data lines 22 are written to pixel circuits 12 which are rendered writable by a gate signal, and the respective pixel circuits 12 control the amount of light emitted from the pixels according to the written pixel signals.

The control circuit 18 controls operation of the gate line driving circuits 14 and of the data line driving circuit 16.

The image display device 10 includes as the gate line driving circuits 14 a gate line driving circuit 14L provided on a left side of the display portion and a gate line driving circuit 14R provided on a right side of the display portion. The gate line driving circuit 14R supplies a gate signal to odd-numbered gate signal lines 20 while the gate line driving circuit 14L supplies a gate signal to even-numbered gate signal lines 20. The gate line driving circuits 14 and the control circuit 18 form the bidirectional shift register and the order of supplying a gate signal to the gate signal lines 20 may be switched between a forward direction from a top to a bottom of the display portion and a reverse direction from the bottom to the top of the display portion.

Figure 2:
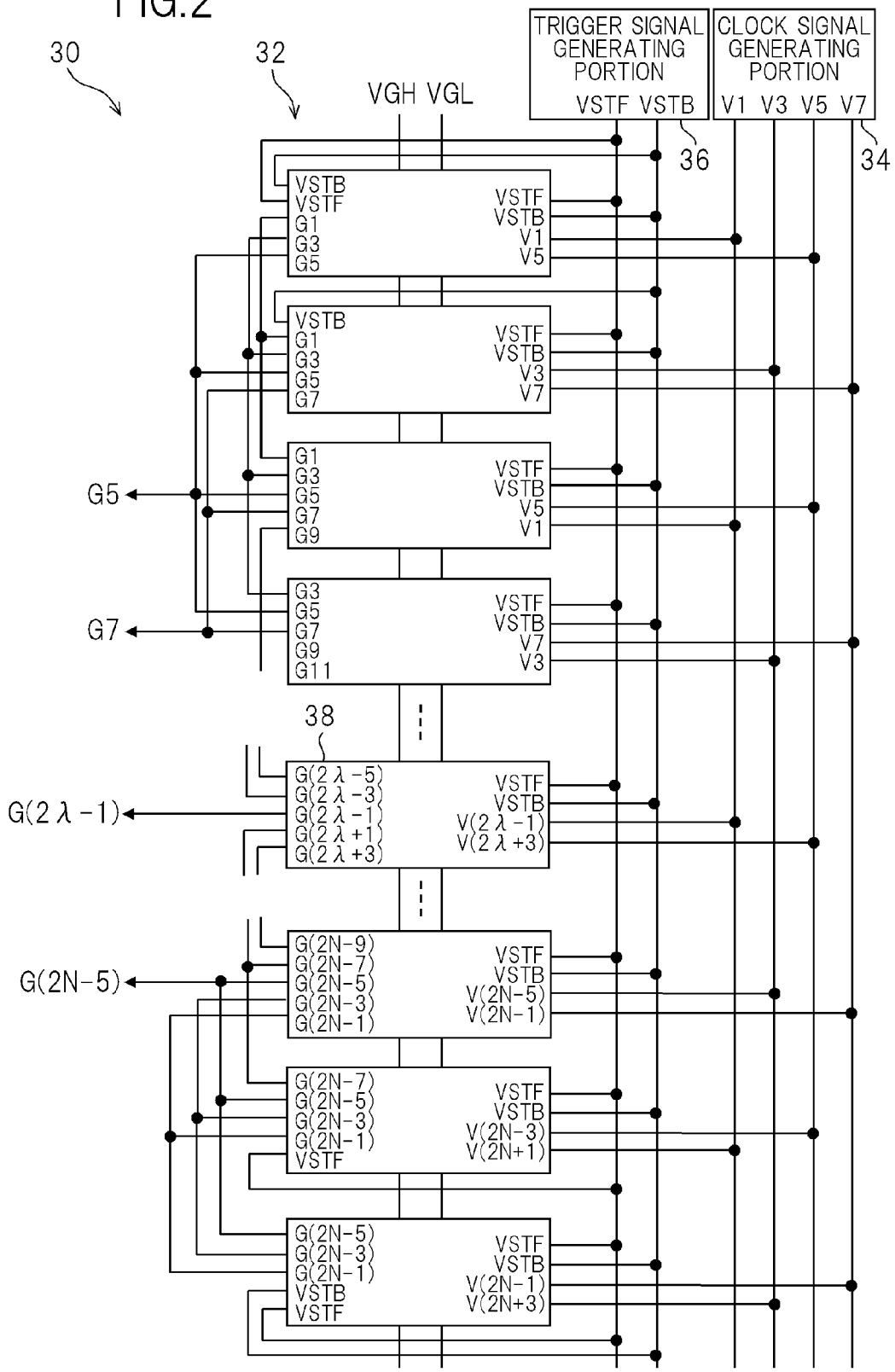
FIG. 2 is a schematic diagram illustrating a structure of a bidirectional shift register according to the first embodiment.

FIG. 2 is a schematic diagram illustrating a structure of a bidirectional shift register 30 used for scanning the gate signal lines 20 of the image display device 10. The bidirectional shift register 30 includes a shift register portion 32, a clock signal generating portion 34, and a trigger signal generating portion 36. The shift register portion 32 is provided in the gate line driving circuits 14 while the clock signal generating portion 34 and the trigger signal generating portion 36 are provided in, for example, the control circuit 18. The shift register portion 32 includes cascaded unit register circuits 38 in a plurality of stages.

FIG. 2 illustrates by way of example a portion of the bidirectional shift register 30 which relates to the shift register portion 32 provided in the gate line driving circuit 14R on the right side. The gate line driving circuit 14R drives in sequence the odd-numbered gate signal lines 20, that is, every other gate signal lines 20 at timings shifted by 2H (H is a horizontal scanning period for one row). On the other hand, the gate line driving circuit 14L drives in sequence the even-numbered gate signal lines 20 at timings shifted by 1H from the odd-numbered gate signal lines 20. The shift register portion 32 of a gate line driving circuit 14 on one side is adapted to be driven by four-phase clock signals. The drive on one side is shifted by 1H from the other side, and thus, the clock signal generating portion 34 generates eight-phase clock signals V1-V8. In each of the clock signals, a pulse having a cycle of 8H and a width of 2H is generated, and clock signals which are adjacent to each other in terms of phase, that is, Vj and V(j+1) are set to have a phase difference of 1H. More specifically, clock pulses which are adjacent to each other in terms of phase overlap by 1H of a 2H period during which the clock pulses are held at an H level. The clock signal generating portion 34 has a first set of signals V1, V3, V5, and V7 and a second set of signals V2, V4, V6, and V8. In both of the sets, the signals are shifted by 2H. The clock signal generating portion 34 supplies the first set to the gate line driving circuit 14R and supplies the second set to the gate line driving circuit 14L. The unit register circuit 38 in each of the stages is correlated with one clock signal (output control clock signal) having a phase that defines the timing of an output pulse in the stage among the clock signals of the plurality of phases.

In forward shift operation of the shift register portion 32, the clock signal generating portion 34 generates clock pulses in sequence in the forward direction, that is, in the order of V1, V2, . . . , V8, V1, . . . . On the other hand, in backward shift operation, the clock signal generating portion 34 generates clock pulses in sequence in the reverse direction, that is, in the order of V8, V7, . . . , V1, V8, . . . . The clock signal generating portion 34 supplies the generated clock pulses to the respective stages of the shift register portions 32 of the gate line driving circuit 14R and the gate line driving circuit 14L, respectively. The clock signal generating portion 34 supplies clock signals in the order of V1, V3, V5, V7, V1, . . . with different phases for the respective stages as the output control clock signals to the gate line driving circuit 14R from the top stage (upper side) down to the bottom stage (lower side). With regard to the gate line driving circuit 14L, the order is set to be V2, V4, V6, V8, V2, . . . .

The trigger signal generating portion 36 generates a forward direction trigger signal VSTF at the start of a forward shift and generates a reverse direction trigger signal VSTB at the start of a backward shift. More specifically, the trigger signal generating portion 36 generates a pulse which rises to the H level in the signal VSTF at the start of a forward shift and generates a pulse which rises to the H level in the signal VSTB at the start of a backward shift.

As described above, the shift register portion 32 is constructed to include the plurality of cascaded unit register circuits 38. Each of the unit register circuits 38 outputs a pulse from an output terminal thereof. The shift register portion 32 outputs a pulse from the unit register circuits 38 in the respective stages. In the forward shift operation, the shift register portion 32 outputs a pulse in sequence from the top stage of the unit register circuits 38, while, in the backward shift operation, the shift register portion 32 outputs a pulse in sequence from the bottom stage of the unit register circuits 38.

The unit register circuits 38 in the plurality of stages which form the shift register portion 32 include main stages having output terminals that are connected to the gate signal lines 20, respectively, and dummy stages which are added to the top and the bottom of the column of the main stages and which are not connected to the gate signal lines 20. The total number of stages in the shift register portion 32 is denoted as N. The value N of the total number of stages is determined by the number of the scanning lines of the image display device 10, that is, the number of the gate signal lines 20, and the number of the top dummy stages and the bottom dummy stages. In this embodiment, two dummy stages are provided at the top and two dummy stages are provided at the bottom. When an output of the unit register circuit 38 in a k-th stage on the gate line driving circuit 14R side is expressed as G(2k−1) (k is a natural number which satisfies 1≤k≤N), outputs G1, G3, G(2N−3), and G(2N−1) from the dummy stages are not output to the gate signal lines 20 while an output G(2λ−1) from a λth stage (λ is a natural number which satisfies 3≤λ≤N−2) which is a main stage is output to a corresponding gate signal line 20.

It is to be noted that, when an output of the unit register circuit 38 in the k-th stage on the gate line driving circuit 14L side is expressed as G(2k), outputs G2, G4, G(2N−2), and G(2N) from the dummy stages are not output to the gate signal lines 20 while an output G(2λ) from the λth stage which is a main stage is output to a corresponding gate signal line 20.

FIG. 2 illustrates connections of input/output terminals of the unit register circuits 38. It is to be noted that, for simple illustration, clock signals are denoted as, for example, V(2λ−1), where a clock signal Vζ having a phase that is expressed by a number ζ exceeding 8 means a clock signal Vξ having a phase that is expressed by a remainder ξ left when ζ is divided by 8.

FIGS. 3 to 7 are schematic circuit diagrams of the unit register circuits 38. FIG. 3, FIG. 4, FIG. 5, FIG. 6, and FIG. 7 illustrate the unit register circuits 38 in a first stage, a second stage, the λth stage, an (N−1)th stage, and an N-th stage, respectively.

Figure 5:
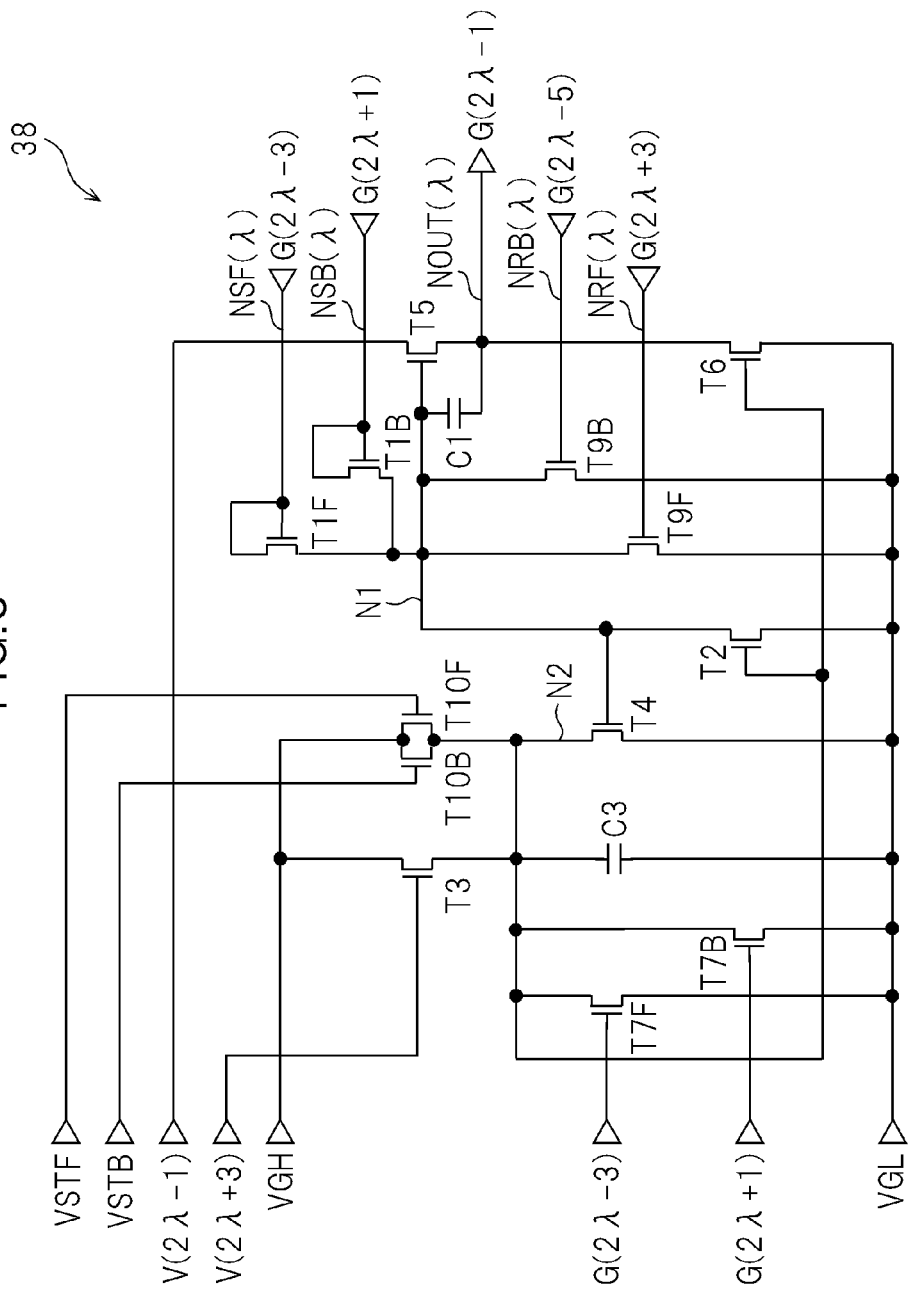
FIG. 5 is a schematic circuit diagram of a unit register circuit in a λth stage of the bidirectional shift register according to the first embodiment.

First, a basic structure of the unit register circuit 38 in the k-th stage (1≤k≤N) is described with reference to the unit register circuit 38 in a main stage (λth stage) illustrated in FIG. 5, and then, a structure of the unit register circuit 38 in the dummy stages (k=1, 2, N−1, and N) is described mainly with reference to points different from those of the basic structure.

The unit register circuit 38 in the k-th stage includes n-channel transistors T1F, T1B, T2 to T6, T7F, T7B, T9F, T9B, T10F, and T10B and capacitors C1 and C3.

The unit register circuit 38 in the k-th stage has an output terminal NOUT(k) for outputting a pulse G(2k−1) of its own stage. The unit register circuit 38 in the k-th stage further has, as terminals to which a pulse or a trigger signal in another stage is input, a forward direction set terminal NSF(k), a reverse direction set terminal NSB(k), a forward direction reset terminal NRF(k), and a reverse direction reset terminal NRB(k). An output signal G(2λ−3) is input to a terminal NSF(λ) in a main stage from a (λ−1)th stage, an output signal G(2λ+1) is input to a terminal NSB(λ) from a (λ+1)th stage, an output signal G(2λ+3) is input to a terminal NRF(λ) from a (λ+2)th stage, and an output signal G(2λ−5) is input to a terminal NRB(λ) from a (λ−2)th stage. Some of the input terminals of the dummy stages do not have corresponding output signals in other stages. If so, a trigger signal is input to such a terminal. The dummy stages are to be described more specifically below.

Further, V(2k−1) and V(2k+3) are input to the unit register circuit 38 in the k-th stage from the clock signal generating portion 34.

Further, to the unit register circuits 38, the forward direction trigger signal VSTF and the reverse direction trigger signal VSTB are input from the trigger signal generating portion 36, and a voltage at the H level is supplied from a power supply VGH and a voltage at the L level is supplied from a power supply VGL.

A drain of the output transistor T5 is connected to a signal line of the output control clock signal V(2k−1) and a source of the output transistor T5 is connected to the output terminal NOUT(k), and the conduction of the transistor T5 is controlled according to the potential of a reference point N1 connected to a gate of the transistor T5. The capacitor C1 is connected between the gate and the source of the transistor T5. The transistor T5 and the capacitor C1 function as an output circuit which outputs the output pulse G(2k−1) of its own stage in synchronization with the clock pulse V(2k−1) with the node N1 as the reference point being at the H level.

Further, a drain of the transistor T6 is connected to the output terminal NOUT(k) and a source of the transistor T6 is connected to the power supply VGL, and on/off of the transistor T6 is controlled according to the potential of a node N2 connected to a gate of the transistor T6. The capacitor C3 is connected between the node N2 and the power supply VGL.

The reference point N1 is connected to the terminals NSF (k) and NSB (k) via the diode-connected transistors T1F and T1B, respectively. The transistors T1F and T1B function as a set circuit which sets the reference point N1 to the H level when an output pulse of another stage is input to the terminal NSF(k) or NSB(k).

The transistors T2, T9F, and T9B which are connected between the reference point N1 and the power supply VGL so as to be in parallel to one another function as switch elements which provide continuity/discontinuity between the reference point N1 and the power supply VGL. A gate of the transistor T2 is connected to the node N2, a gate of the transistor T9F is connected to the terminal NRF(k), and a gate of the transistor T9B is connected to the terminal NRB(k). When the potential of the node N2, the terminal NRF(k), or the terminal NRB(k) is at the H level, these transistors set the potential of the reference point N1 to the L level. In particular, the transistors T9F and T9B function as a reset circuit which sets the reference point N1 to the L level when an output pulse of another stage is input to the terminal NRF(k) or NRB(k).

Here, the node N2 is set to the H level except for a period during which the reference point N1 is set to the H level. The transistor T2 is ON during a period in which the node N2 is at the H level, and thus, the continuity is maintained for a relatively long time. As a result, a threshold voltage Vth of the transistor T2 is shifted to the positive direction, and the ability of the transistor T2 to fix the reference point N1 at the L level is lowered. On the other hand, a pulse of the clock signal V(2k−1) is applied to the drain of the transistor T5 even outside the set period of the reference point N1 (output period of the k-th stage), and the pulse has a function to pull up the potential of the reference point N1 via a gate-drain capacitance Cgd of the transistor T5. In particular, as described below, at least the size of the transistors T5 in the main stages is required to be large, and thus, the gate-drain capacitance Cgd becomes larger accordingly and the pulled-up amount of the potential of the reference point N1 becomes larger accordingly. Therefore, the transistors T9F and T9B are provided so that the reference point N1 is preferably reset to the L level.

The transistors T3, T10F, and T10B which are connected between the node N2 and the power supply VGH so as to be in parallel to one another function as switch elements which provide continuity/discontinuity between the node N2 and the power supply VGH. A gate of the transistor T3 is connected to a signal line of a clock signal (2k+3), a gate of the transistor T10F is connected to a signal line of the forward direction trigger signal VSTF, and a gate of the transistor T10B is connected to a signal line of the reverse direction trigger signal VSTB. When the potential of the clock signal (2k+3), the forward direction trigger signal VSTF, or the reverse direction trigger signal VSTB is at the H level, these transistors set the potential of the node N2 at the H level.

The transistors T4, T7F, and T7B which are connected between the node N2 and the power supply VGL so as to be in parallel to one another function as switch elements which provide continuity/discontinuity between the node N2 and the power supply VGL. A gate of the transistor T4 is connected to the node N1, a gate of the transistor T7F is connected to the terminal NSF(k), and a gate of the transistor T7B is connected to the terminal NSB(k). When the potential of the node N1, the terminal NSF(k), or the terminal NSB(k) is at the H level, these transistors set the potential of the node N2 at the L level.

Figure 3:
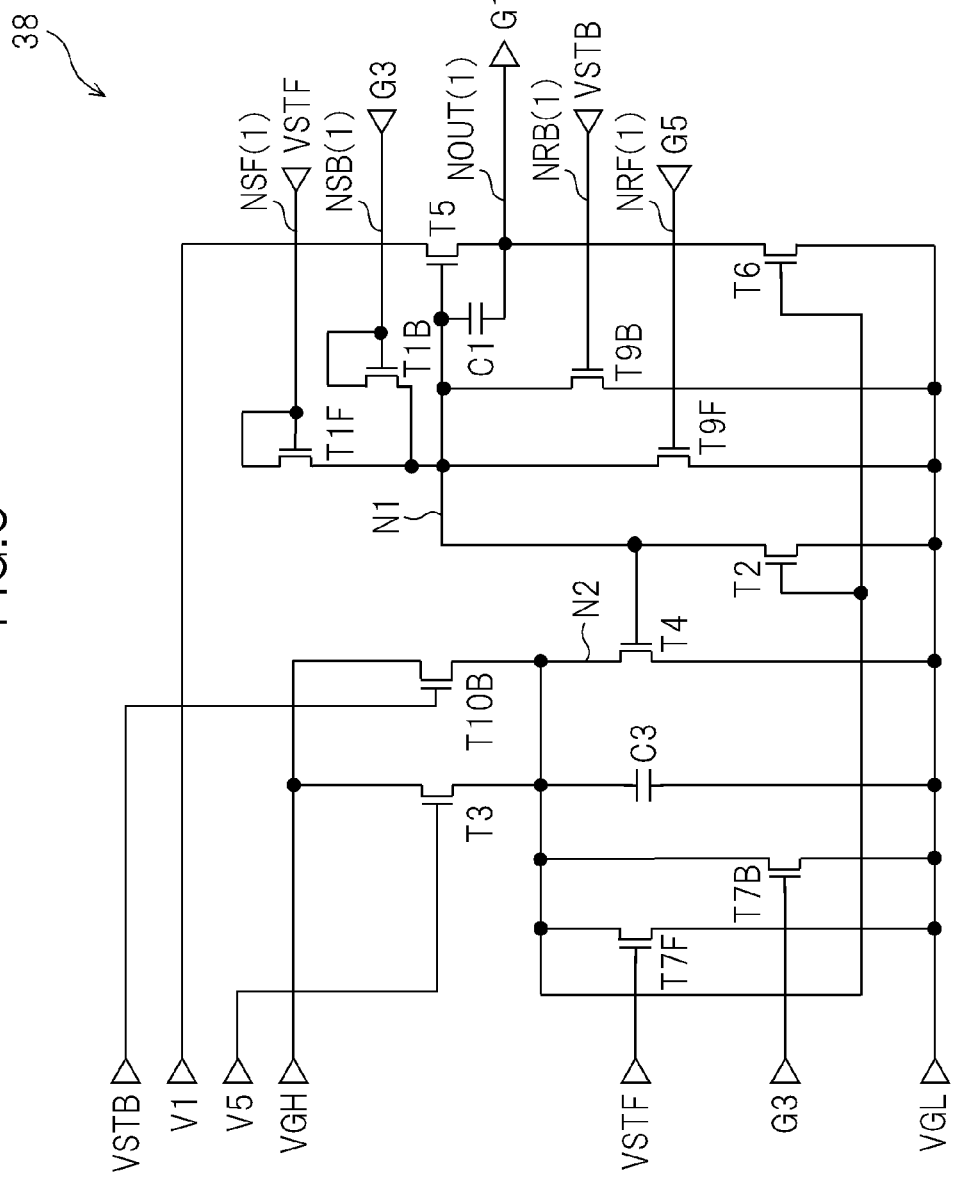
FIG. 3 is a schematic circuit diagram of a unit register circuit in a first stage of the bidirectional shift register according to the first embodiment.
Figure 4:
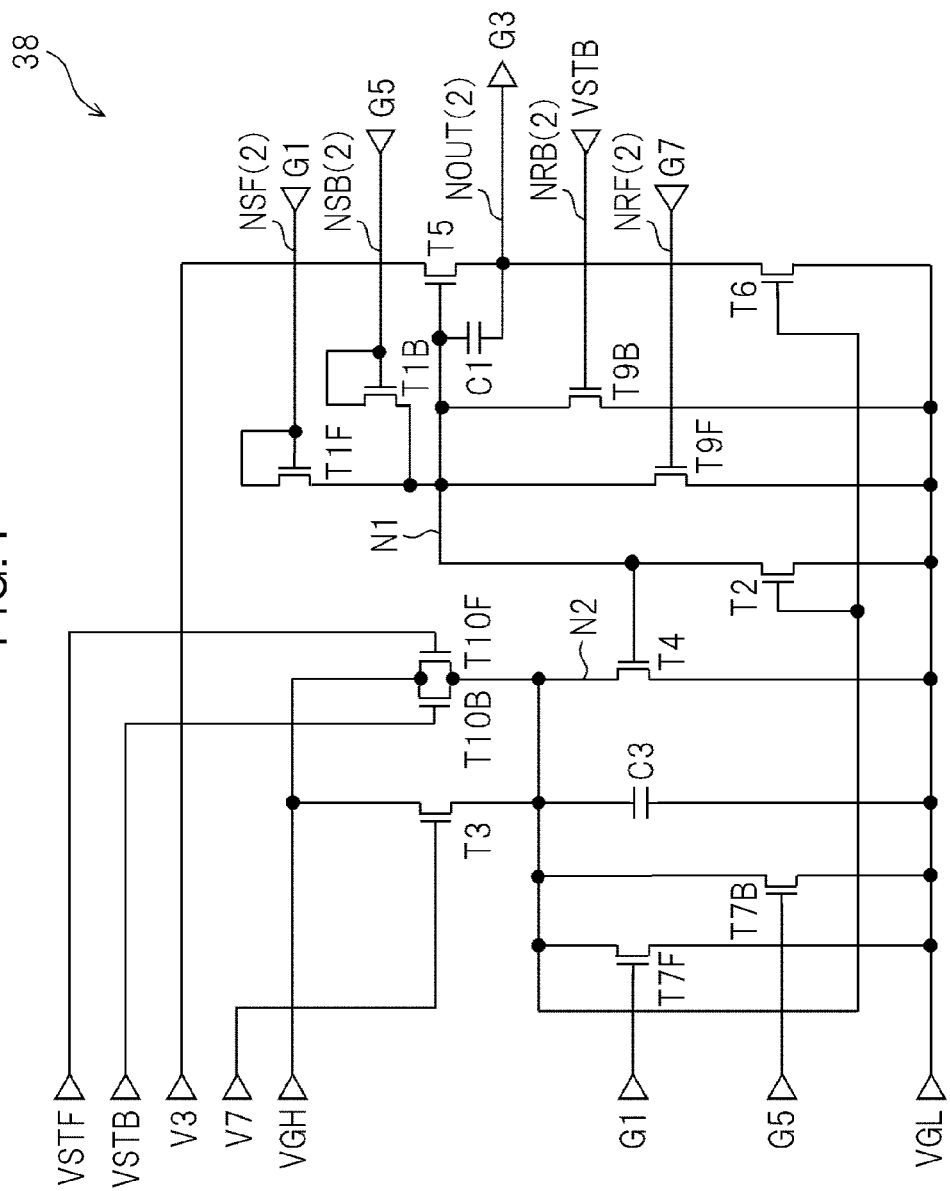
FIG. 4 is a schematic circuit diagram of a unit register circuit in a second stage of the bidirectional shift register according to the first embodiment.
Figure 6:
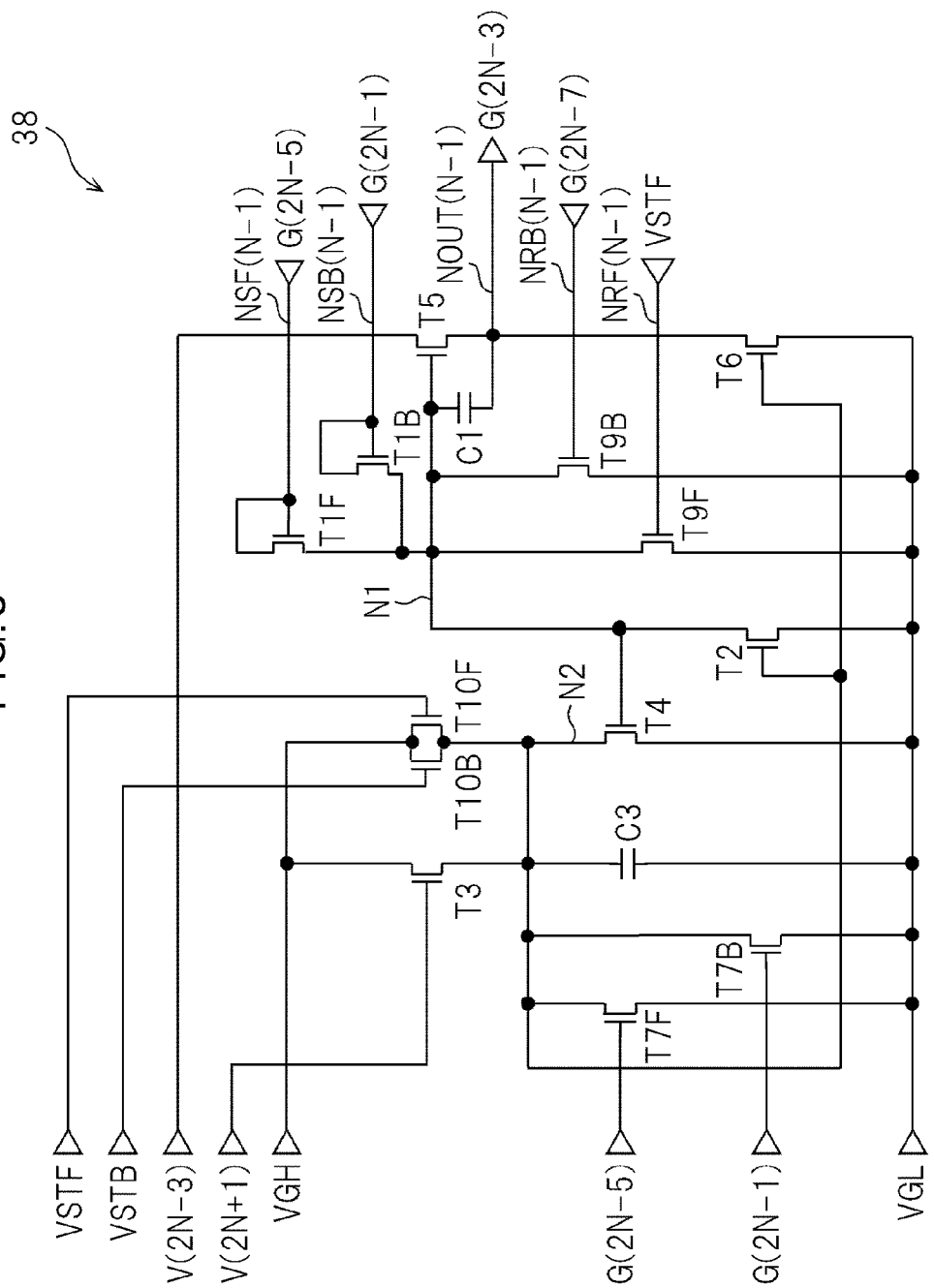
FIG. 6 is a schematic circuit diagram of a unit register circuit in an (N−1)th stage of the bidirectional shift register according to the first embodiment.
Figure 7:
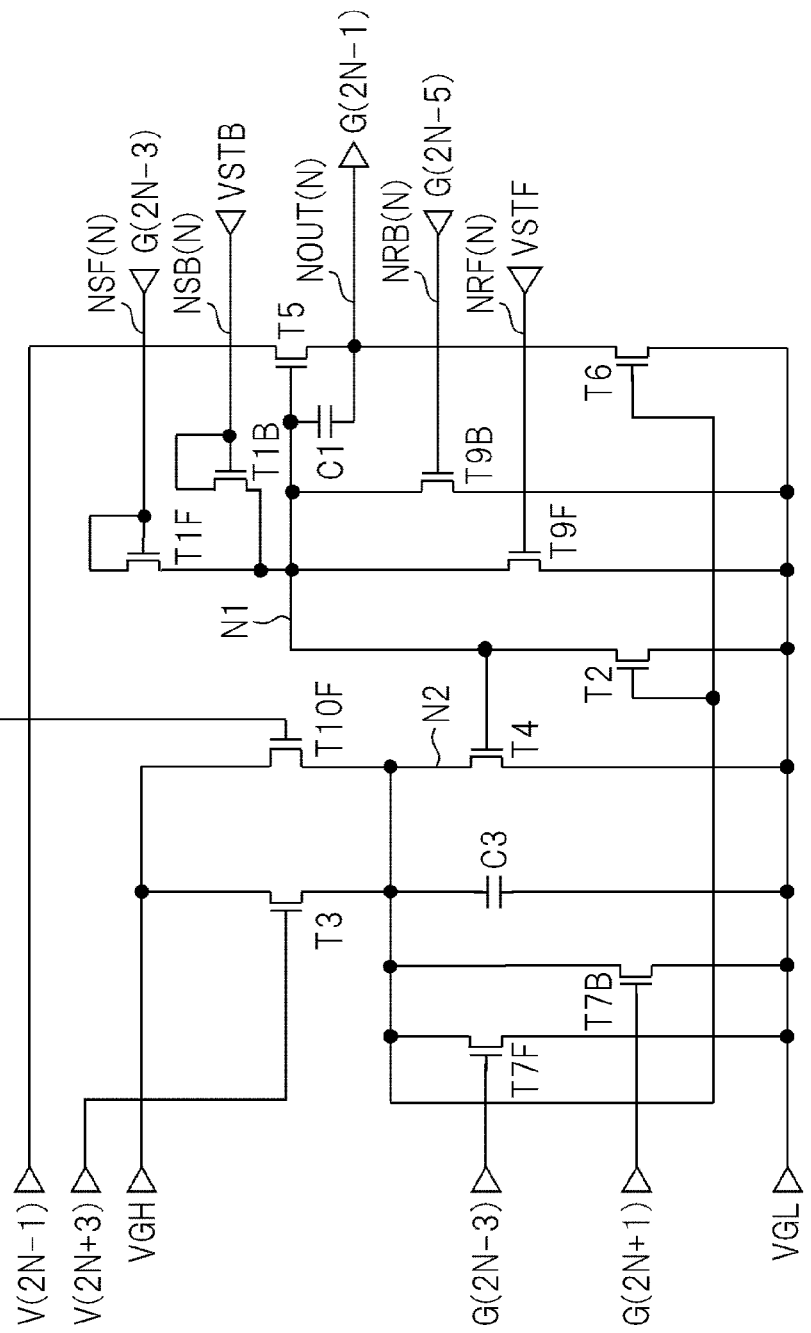
FIG. 7 is a schematic circuit diagram of a unit register circuit in an N-th stage of the bidirectional shift register according to the first embodiment.

Next, the unit register circuits 38 in the dummy stages are described. The unit register circuit 38 in the first stage illustrated in FIG. 3 is different from the unit register circuit 38 illustrated in FIG. 5 in not having the transistor T10F. The unit register circuit 38 in the N-th stage illustrated in FIG. 7 is different from the unit register circuit 38 illustrated in FIG. 5 in not having the transistor T10B. The unit register circuit 38 in the second stage illustrated in FIG. 4 and the unit register circuit 38 in the (N−1)th stage illustrated in FIG. 6 are similar to the unit register circuit 38 illustrated in FIG. 5 with regard to the basic structure of the circuit.

As described above, with regard to the dummy stages, there are cases in which no output signal in another stage for supplying an output pulse to the terminal NSF, NSB, NRF, or NRB exists. More specifically, terminals having no output signal from another stage are NSF in the first stage, NRB in the first and second stages, NSB in the N-th stage, and NRF in the (N−1)th and N-th stages.

Among these, the set terminals NSF and NSB are used for inputting a signal which sets the reference point N1 to the H level in preparation for generating an output pulse. Therefore, to the set terminals NSF in the first stage, a pulse of the forward direction trigger signal VSTF is input from the trigger signal generating portion 36 at the start of a forward shift. Further, to the set terminals NSB in the N-th stage, a pulse of the reverse direction trigger signal VSTB is input at the start of a backward shift.

On the other hand, the reset terminals NRF and NRB are used for inputting a signal which resets the reference point N1 to the L level after an output pulse is generated. By resetting the reference point N1 to the L level, an output pulse is prevented from being generated by a pulse of an output control clock signal which is input after that. Here, outputs of the dummy stages are not used for driving the gate signal lines 20.

Further, outputs of the (N−1)th and N-th stages which are dummy stages that operate after output pulses in the main stages are generated in a forward shift, and outputs of the first and second stages which are dummy stages that operate after output pulses in the main stages are generated in a backward shift are not used as signals for setting the reference point N1 in another stage. Therefore, these dummy stages which operate at the end of each shift operation do not present any specific problem even if the dummy stages repeatedly generate output pulses according to repetition of clock pulses. Therefore, it is sufficient that a signal of some kind at the H level is input to the terminals NRF in the (N−1)th and N-th stages in a forward shift and to the terminals NRB in the first and second stages in a backward shift before the start of shift operation with regard to the next frame to make the reference point N1 in the stage concerned enter a reset state. As an example, in this embodiment, the forward direction trigger signal VSTF is input to the terminals NRF in the (N−1)th and N-th stages while the reverse direction trigger signal VSTB is input to the terminals NRB in the first and second stages.

The output terminal NOUT in a main stage is connected to the gate signal line 20 and to the plurality of pixel circuits 12 as loads to be driven. As the length of the gate signal line 20 increases due to a larger screen and as the number of the pixel circuits 12 connected to the gate signal line 20 increases due to higher resolution, the loads to be driven become heavier. The output transistor T5 in a main stage is required to have a driving ability corresponding to the loads, and is designed to have, for example, a large gate width (channel width). For example, the output transistor T5 in a main stage is designed to have a channel width as large as about 5,000 μm. On the other hand, dummy stages are not connected to the gate signal lines 20, and thus, the driving ability of the output transistor T5 in a dummy stage is set to be lower than that in a main stage. For example, the output transistor T5 in a dummy stage is set to have a channel width of about 500 μm which is ⅒ of that of the output transistor T5 in a main stage. In this way, the size of the transistors T5 in the dummy stages reduces, and thus, the unit register circuits 38 in the dummy stages may be miniaturized. Further, power consumption of the dummy stages may be reduced.

In the above, the structure of the gate line driving circuits 14 is described taking as an example the gate line driving circuit 14R on the right side for driving the odd-numbered gate signal lines 20. A structure of the gate line driving circuit 14L on the left side for driving the even-numbered gate signal lines 20 is similar to that of the gate line driving circuit 14R on the right side, but is described briefly for confirmation. For example, the λth stage of the shift register portion 32 is connected to the gate signal line 20 in the (2λ−1)th row in the gate line driving circuit 14R on the right side, while the λth stage of the shift register portion 32 is connected to the gate signal line 20 in the (2λ)th row in the gate line driving circuit 14L on the left side. In a forward shift, the gate signal line 20 in the (2λ)th row is driven with the delay of 1H from the drive of the gate signal line 20 in the (2λ−1)th row. As is easily conceived from this relationship, the output terminal NOUT (k) of the unit register circuit 38 in the k-th stage of the gate line driving circuit 14L outputs a signal G(2k), and G(2λ−2), G(2λ+2), G(2λ+4), and G(2λ−4) are input to the terminals NSF(λ), NSB(λ), NRF(λ), and NRB(λ), respectively, in the main stages. Further, V(2k) as the output control clock signal is input to the transistor T5, and a clock signal V(2k+4) is applied to the gate of the transistor T3.

Figure 8:
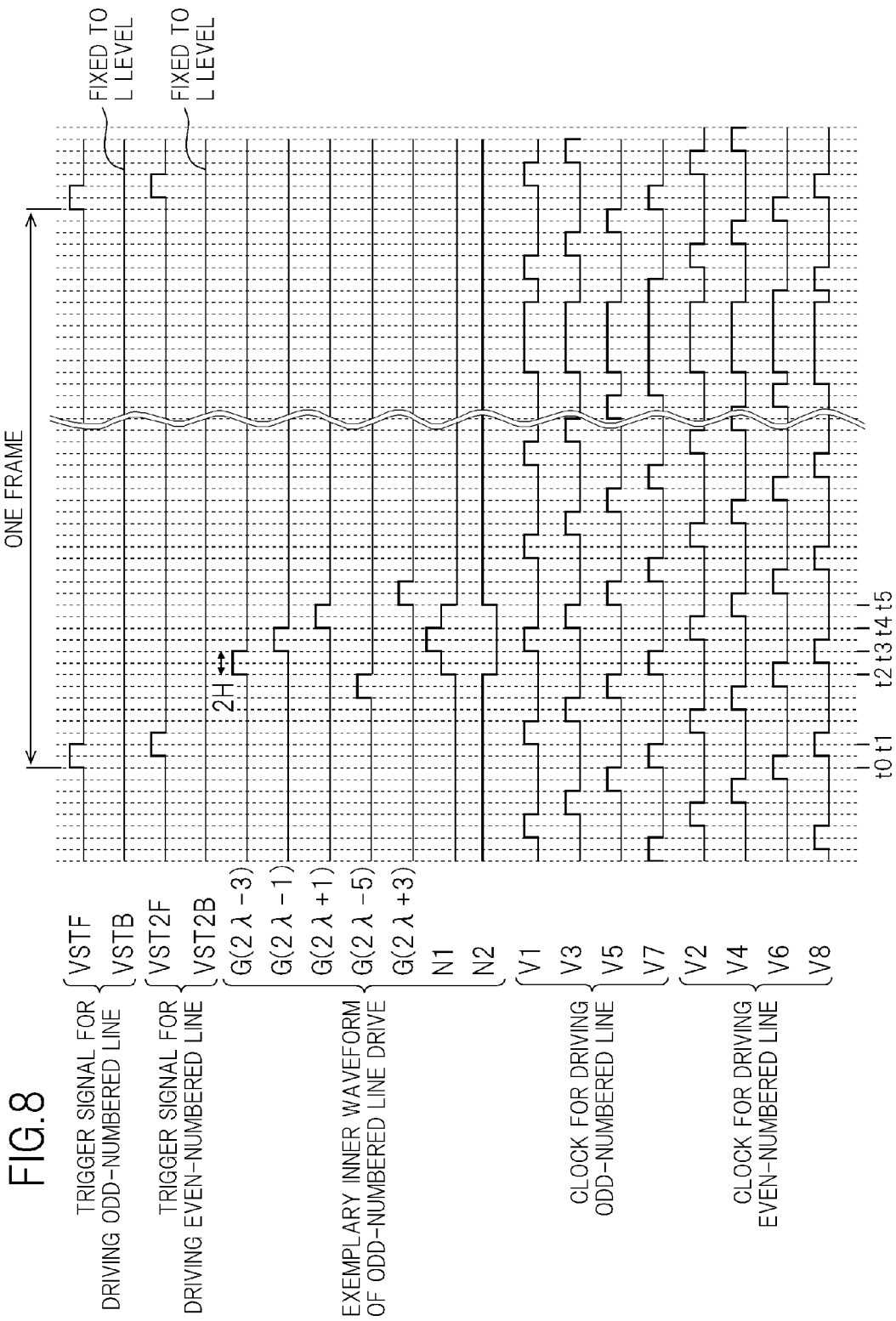
FIG. 8 is a timing diagram illustrating waveforms of various signals in forward shift operation of the bidirectional shift register according to the first embodiment.

Next, operation of the bidirectional shift register 30 is described. FIG. 8 is a timing diagram illustrating waveforms of various signals in the forward shift operation.

The forward shift starts by, at the head of image signals for one frame, generation of pulses of forward direction trigger signals by the trigger signal generating portion 36 (at times t0 and t1). The trigger signal generating portion 36 generates, after generating a pulse of the forward direction trigger signal VSTF for driving the odd-numbered lines at the time t0, a pulse of a forward direction trigger signal VSTF2 for driving the even-numbered lines at the time t1, which is delayed by 1H from t0. On the other hand, the reverse direction trigger signal VSTB for driving the odd-numbered lines and a reverse direction trigger signal VSTB2 for driving the even-numbered lines are fixed at the L level.

In the unit register circuits 38 in the second to N-th stages, when a pulse of the signal VSTF is input, the transistor T10F is turned on, the node N2 is pulled up to the H level, and, as a result, the transistor T2 is turned on to reset the reference point N1 to the L level. On the other hand, in the unit register circuits 38 in the first to (N−αb)th stages, when a pulse of the signal VSTB is input, the transistor T10B is turned on to reset the reference point N1 to the L level.

As described above, the clock signal generating portion 34 generates, in the forward shift operation, the pulses in sequence in the forward direction. More specifically, the clock signal generating portion 34 raises a pulse of a clock signal V(j+1) with a delay of 1H from a rising edge of a pulse of a clock signal Vj (j is a natural number which satisfies 1≤j≤7), and further, raises a pulse of the clock signal V1 with a delay of 1H from a rising edge of a pulse of the clock signal V8.

Here, first, forward shift operation of the unit register circuit 38 in a main stage (λth stage) in the gate line driving circuit 14R is described.

Before the operation in the λth stage, the first to (λ−1)th stages are operated in sequence to output pulses having a width of 2H with a phase difference of 2H therebetween. When a pulse of the output signal G(2λ−3) in the (λ−1)th stage is input to the terminal NSF(λ) (time t2), the reference point N1 is set to a potential (VGH-Vth (T1F)) corresponding to the H level, the transistor T5 is turned on, and the interterminal voltage of the capacitor C1 is set to the same potential. Here, the transistor T4 is turned on to set the node N2 to the L level. Further, here, the transistor T7F is also turned on, and thus, the node N2 is set to the L level faster than in a case in which only the transistor T4 is turned on. The potential of the node N2 is held in the capacitor C3. The node N2 is at the L level, and thus, the transistors T2 and T6 are in an off state.

An output pulse in the (λ−1)th stage is generated in synchronization with a pulse of a clock V(2λ−3) (in FIG. 8, a pulse of the clock V7), and thus, at a time t3 which is delayed by 2H from the time t2, a pulse of a clock signal V(2λ−1) (in FIG. 8, a pulse of the clock signal V1) is input to the λth stage. The pulse of the clock signal V(2λ−1) pulls up the potential of the source of the transistor T5. Then, the potential of the node N1 is further pulled up by the bootstrap effect, and the pulse of the clock signal V(2λ−1) becomes a pulse of the signal G(2λ−1) without lowering the potential thereof to be output from the terminal NOUT(λ). The pulse of the signal G(2λ−1) is input to the terminal NSF in the (λ+1)th stage, and sets the node N1 in that stage to the H level.

When, at a time t4, the pulse of the clock signal V(2λ−1) falls, the pulse of the signal G(2λ−1) also falls. On the other hand, the potential of the reference point N1 is held at the H level.

At the time t4, the (λ+1)th stage outputs a pulse of the signal G(2λ+1) in synchronization with a pulse of a clock signal V(2λ+1). In this way, each of the stages outputs a pulse of its own with a delay of 2H from the output of a pulse in the preceding stage. The (λ+2)th stage which receives the output of the pulse in the (λ+1)th stage outputs a pulse of the signal G(2λ+3) at a time t5 which is delayed by 2H from the time t4.

In the λth stage, when, at the time t5, the pulse of the signal G(2λ+3) is input to the terminal NRF, the transistor T9F is turned on to reset the reference point N1 to the L level. At the same time, a clock signal V(2λ+3) turns on the transistor T3 to pull up the node N2 to the H level. As a result, the transistor T6 is turned on to connect the output terminal NOUT(λ) to the power supply VGL.

It is to be noted that the transistor T3 is periodically turned on by the clock signal V(2λ+3) also at times other than the time t5, and satisfactorily holds the node N2 at the H level except for a period in which the reference point N1 is in a set state. This causes the output terminal NOUT(λ) to be held at the L level except for the period in which the reference point N1 is set to the H level.

By the above-mentioned operation, during the period of 2H which precedes the time t2, a pulse is input from the (λ−2)th stage to the terminal NRB(λ) to turn on the transistor T9B. The period is before the reference point N1 is set to the H level by the input of a pulse from the (λ−1)th stage to the terminal NSF(λ), and thus, the above-mentioned operation is not affected. Further, during the period of 2H between the times t4 and t5, a pulse is input from the (λ+1)th stage to the terminal NSB(λ), and a potential at the H level is applied from the terminal NSB(λ) via the transistor T1B to the reference point N1. The period is before the reference point N1 is reset to the L level by the input of a pulse from the (λ+2)th stage to the terminal NRF(λ), and thus, the above-mentioned operation is not affected.

Further, the timing of setting the reference point N1 to the H level is after a pulse which precedes a pulse at the time t3 by a cycle among the plurality of pulses of the clock signal V(2λ−1), and the timing of resetting the reference point N1 to the L level is before a pulse which is generated after a cycle, and therefore, a pulse is output from the terminal NOUT(λ) only once, which is in synchronization with the pulse at the time t3 among the pulses of the clock signal V(2λ−1).

As described above, a main stage receives an output pulse from the previous stage to cause the reference point N1 to be in the set state, and receives an output pulse from the stage next to the subsequent stage to cause the reference point N1 to be in the reset state. However, the dummy stage as the first stage does not have the previous stage. Therefore, as described above, the first stage has a structure in which a pulse of the forward direction trigger signal VSTF is input to the terminal NSF. The first stage receives a pulse of the signal VSTF which is generated at the time t0 to set the reference point N1 to the H level. Subsequent operation in the first stage is similar to that in the λth stage described above. Further, the dummy stages as the (N−1)th and N-th stages do not have the stage next to the subsequent stage. Therefore, as described above, the (N−1)th and N-th stages have a structure in which a pulse of the forward direction trigger signal VSTF is input to the terminal NRF. The reference point N1 in the (N−1)th and N-th stages is set to the H level at the end of the forward shift operation for one frame, and then, in response to a pulse of the signal VSTF which is generated at the start of the subsequent frame, is reset to the L level.

The forward shift operation of the stages in the gate line driving circuit 14R is described above. The forward shift operation of the stages in the gate line driving circuit 14L is similar to that of the corresponding stages in the gate line driving circuit 14R. However, it is to be noted that the stages in the gate line driving circuit 14L operate with a delay of 1H from the corresponding stages in the gate line driving circuit 14R, respectively.

Figure 9:
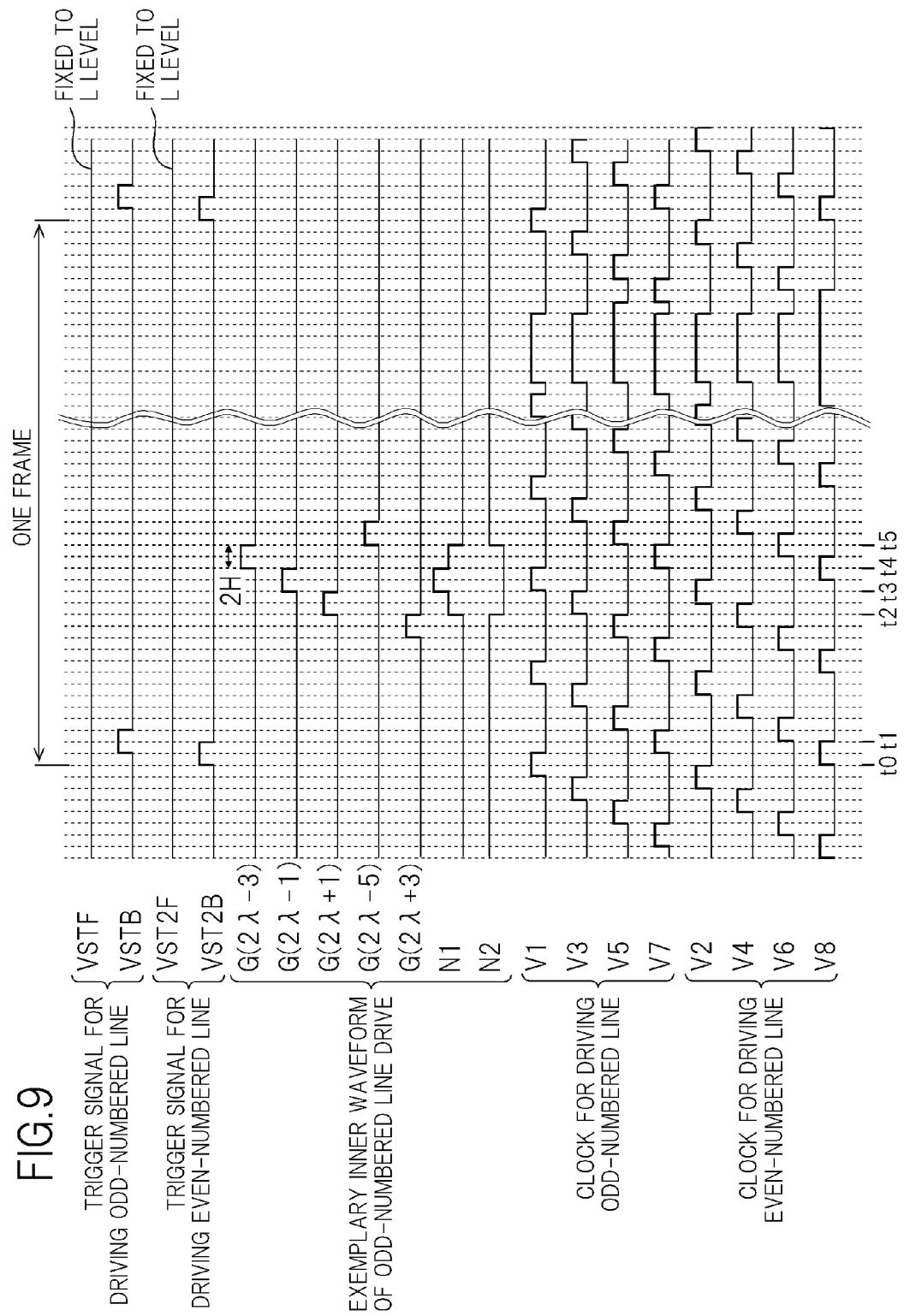
FIG. 9 is a timing diagram illustrating waveforms of various signals in backward shift operation of the bidirectional shift register according to the first embodiment.

FIG. 9 is a timing diagram illustrating waveforms of various signals in the backward shift operation.

The backward shift starts by, at the head of image signals for one frame, generation of pulses of reverse direction trigger signals by the trigger signal generating portion 36 (at times t0 and t1). The trigger signal generating portion 36 generates, after generating a pulse of the reverse direction trigger signal VSTB2 for driving the even-numbered lines at the time t0, the pulse of a reverse direction trigger signal VSTB for driving the odd-numbered lines at the time t1, which is delayed by 1H from t0. On the other hand, the forward direction trigger signal VSTF for driving the odd-numbered lines and the forward direction trigger signal VSTF2 for driving the even-numbered lines are fixed at the L level.

As described above, the clock signal generating portion 34 generates, in the backward shift operation, the pulses in sequence in the reverse direction. More specifically, the clock signal generating portion 34 raises the pulse of the clock signal Vj with a delay of 1H from a rising edge of the pulse of the clock signal V(j+1), and further, raises a pulse of the clock signal V8 with a delay of 1H from a rising edge of the pulse of the clock signal V1.

The unit register circuit 38 in each of the stages of the shift register portion 32 has a circuit structure in which a portion related to the terminal NSF and a portion related to the terminal NSB are symmetrical with each other and in which a portion related to the terminal NRF and a portion related to the terminal NRB are symmetrical with each other. More specifically, according to the four-phase clocks used for driving the gate line driving circuit 14 on one side, in both the forward shift operation and the backward shift operation, the unit register circuits 38 in each of the stages is adapted to receive at the terminal NSB an output pulse which is generated with an advance of one phase of the clock, that is, 2H, from that of its own stage and causes the reference point N1 to be in the set state, and is adapted to receive at the terminal NRB an output pulse which is generated with a delay of two phases of the clock, that is, 4H, from that of its own stage and causes the reference point N1 to be in the reset state. Further, both ends of the shift register portion 32, that is, the top dummy stages and the bottom dummy stages are in a symmetrical relationship in structure with respect to shifts in opposite directions. More specifically, the top dummy stages in the backward shift operation function similarly to the bottom dummy stages in the forward shift operation, while the bottom dummy stages in the backward shift operation function similarly to the top dummy stages in the forward shift operation. Therefore, if the control circuit 18 switches the trigger signals and switches the order of generation of the clock pulses, the shift register portion 32 performs the backward shift operation similarly to the forward shift operation.

For example, in the N-th stage in the gate line driving circuit 14R, a pulse of the reverse direction trigger signal VSTB is input to the terminal NSB at the time t1 and the reference point N1 is set to the H level. After that, in synchronization with a pulse of a clock signal V(2N−1) which is generated first, a pulse is generated in an output signal G(2N−1). In this way, pulses are output from the stages in sequence in the opposite order to that in the forward shift operation.

The backward shift operation is described in the above taking as an example the gate line driving circuit 14R. The backward shift operation of each of the stages in the gate line driving circuit 14L is similar to that of the corresponding stage in the gate line driving circuit 14R. However, each of the stages in the gate line driving circuit 14L performs operation with an advance of 1H from the corresponding stage in the gate line driving circuit 14R.

Here, with its own stage being a starting point, another stage which inputs a pulse to the reset terminal NRF is set to be a stage which is farther than still another stage that inputs a pulse to the set terminal NSB, and, another stage which inputs a pulse to the reset terminal NRB is set to be a stage which is farther than still another stage that inputs a pulse to the set terminal NSF. In this structure, in the forward shift operation, the pulses which are input to the terminals NSB and NRB that are related to the backward shift operation do not affect the forward shift operation, and, similarly, in the backward shift operation, the pulses which are input to the terminals NSF and NRF that are related to the forward shift operation do not affect the backward shift operation. Therefore, for example, it is not necessary to provide a switch for selectively accepting the inputs to the terminals NSF and NRF in the forward shift operation and selectively accepting the inputs to the terminals NSB and NRB in the backward shift operation. More specifically, the shift register portion 32 and the unit register circuits 38 therein may have a basic circuit structure which is not switched between one for the forward shift and one for the backward shift. A transistor used as the switch is not necessary, and thus, the circuit structure of the unit register circuit 38 becomes simpler accordingly, which makes it easier to miniaturize the unit register circuit 38. Further, a signal line for supplying a switching signal to the transistor concerned in each of the stages is not required to be arranged along the shift register portion 32, and thus, the size increase in a horizontal direction of the gate line driving circuits 14 may be suppressed.

It is to be noted that, as described in the description of the forward shift operation, in synchronization with the operation of resetting the reference point N1, a clock signal is used to turn on the transistor T3 and the node N2 is pulled up to the H level. In this embodiment, clocks for driving a gate line driving circuit 14 on one side are four-phase clocks, and, for example, in the gate line driving circuit 14R, the reference point N1 is reset to a timing which is delayed by two phases of the clock from the output control clock signal $V(2k-1)$ to the output transistor T5 in its own stage. The clock signal which turns on the transistor T3 at the timing of resetting the reference point N1 is $V(2k+3)$ in the forward shift and $V(2k-5)$ in the backward shift, which are a common clock signal. This means that, in this embodiment, a clock signal for controlling the transistor T3 is also not required to be switched between one for the forward shift and one for the backward shift.

By the way, in the embodiment described above, a gate line driving circuit 14 on one side is driven by four-phase clock signals, and, basically, outputs of the (k−2)th stage, the (k−1)th stage, the (k+1)th stage, and the (k+2)th stage are input to the unit register circuit 38 in the k-th stage so that the reference point N1 is set to the H level by output pulses in (k−1)th stage and the (k+1)th stage and that the reference point N1 is reset to the L level by output pulses in the (k−2)th stage and the (k+2)th stage. Such a structure materializes a bidirectional shift register which does not basically require switch between a circuit structure for the forward shift and a circuit structure for the backward shift. Further, in such a structure, after an output pulse of each of the stages falls, the reference point N1 is reset from the H level to the L level. More specifically, after an output pulse of each of the stages ends, a subsequent set period in which the reference point N1 in the stage is held in the set state is provided. By the existence of the subsequent set period, operation of the bidirectional shift register according to the present invention is not operation in which the potential of the reference point N1 is abruptly pulled down from a potential higher than the H level to the L level and the transistor M6 is turned on, and thus, unstable operation due to timing misalignment and deformation of the waveform of each of the signals such as a through current is less liable to occur. Here, the present invention is not limited to the structure of the above-mentioned embodiment. A generalized structure of the bidirectional shift register according to the present invention is as follows. It is assumed that the shift register portion 32 is driven by n-phase clock signals (n is an integer which is equal to or larger than 3), and $\alpha f$, $\alpha b$, $\beta f$, and $\beta b$ are natural numbers which satisfy both $\alpha f < \beta b < n$ and $\alpha b < \beta f < n$. Then, outputs of a (k−βb)th stage, a (k−αf)th stage, a (k+αb)th stage, and a (k+βf)th stage are input to the unit register circuit 38 in the k-th stage so that the reference point N1 is set to the H level by output pulses in the (k−αf)th stage and the (k+αb)th stage and that the reference point N1 is reset to the L level by output pulses in the (k−βb)th stage and the (k+βf)th stage. Such a structure also materializes a bidirectional shift register which does not basically require switch between circuit structures with the improved stability of operation.

It is to be noted that, because $\alpha f < \beta b$ and $\alpha b < \beta f$, it follows that both $\beta f$ and $\beta b$ are equal to or larger than 2. Then, it follows that the value N of the total number of stages is equal to or larger than 3. However, in a bidirectional shift register having $\beta b$ dummy stages at the top and $\beta f$ dummy stages at the bottom as in the above-mentioned embodiment, at least two main stages are necessary for the forward shift and the backward shift, and thus, it follows that N is equal to or larger than 6.

It is to be noted that, in some cases, similarly to the case of the above-mentioned dummy stages, a signal as an alternative an output pulse in another stage is input to the terminal NSF, NSB, NRF, or NRB of the unit register circuits 38 at both ends of the generalized shift register portion 32. More specifically, with regard to a bidirectional shift register having N stages, in the unit register circuits 38 in the first to αf-th stages, the forward direction trigger signal is input to the terminal NSF, and the signal sets the reference point N1 to the H level at the start of the forward shift. In the unit register circuits 38 in the (N−αf+1)th to N-th stages, the reverse direction trigger signal is input to the terminal NSB, and the signal causes the reference point N1 to be in the set state at the start of the backward shift. Further, as a reset signal to be input to the terminal NRF in the (N−βf+1)th to N-th stages, the forward direction trigger signal may be used. As a reset signal to be input to the terminal NRB in the first to βb-th stages, the reverse direction trigger signal may be used.

The basic structure of the unit register circuit 38 may include the transistors T10F and T2 as a circuit for setting the reference point N1 to the L level as an initial setting by a pulse of the forward direction trigger signal VSTF. However, as described above, in the first to αf-th stages, a pulse of the signal VSTF is used for setting the reference point N1 to the H level. Therefore, in the unit register circuits 38 in the first to αf-th stages, the circuit structure does not have the transistor T10F similarly to the case of the first stage in the above-mentioned embodiment (see FIG. 3) so that the reference point N1 is not reset to the L level. Similarly, the basic structure of the unit register circuit 38 may include the transistors T10B and T2 as a circuit for setting the reference point N1 to the L level as the initial setting by a pulse of the reverse direction trigger signal VSTB. However, as described above, in the (N−αb+1)th to N-th stages, a pulse of the signal VSTB is used for setting N1 to the H level. Therefore, in the unit register circuits 38 in the (N−αb+1)th to N-th stages, the circuit structure does not have the transistor T10B similarly to the case of the N-th stage in the above-mentioned embodiment (see FIG. 7) so that the reference point N1 is not reset to the L level.

αf corresponds to a period from when the reference point N1 is set to when an output pulse rises (preceding set period) in the forward shift operation while αb corresponds to the preceding set period in the backward shift operation. When the preceding set period becomes long, the potential of the reference point N1 held by the capacitor C1 may be lowered by a leakage current of the transistor T9F or T9B or the like, which may result in an inconvenience that, when a clock pulse is input to the drain of the transistor T5, the potential of the gate of the transistor T5 is not high enough to output a pulse from the terminal NOUT. Therefore, when there is concern about the above-mentioned inconvenience, for example, when the capacitance of the capacitor C1 is not so large, it is preferred that, as in the above-mentioned embodiment, αf and αb be set to 1 to make short the preceding set period.

Further, from the viewpoint of symmetry between operation of the image display device 10 in the forward shift operation and that in the backward shift operation, it is preferred that αf=αb and βf=βb be satisfied.

In the above-mentioned embodiment where n=4 and βf=βb=2, as described above, a clock signal used for controlling the transistor T3 may be common between the forward shift operation and the backward shift operation. Such a structure in which a clock signal for controlling the transistor T3 is common to the two directions is materialized when βf+βb=n.

In the above-mentioned embodiment, the reverse direction trigger signal VSTB is fixed to the L level in the forward shift operation, and the forward direction trigger signal VSTF is fixed to the L level in the backward shift operation. In this driving method, in the forward shift operation, the transistor T9B having a gate connected to the reverse direction reset terminal NRB in the first to βb-th stages is held in the off state, and, in the backward shift operation, the transistor 19F having a gate connected to the forward direction reset terminal NRF in the (N−βf+1)th to N-th stages is held in the off state. Such a transistor in which a voltage is applied between the drain and the source thereof and which is held in the off state for a long time may have a change in transistor characteristics which is called Vth shift. More specifically, in an n-channel transistor, the threshold voltage Vth is liable to be lowered and a leakage current is liable to occur. Such a Vth shift particularly presents a problem in an a-Si thin film transistor (TFT). For example, it is known that a Vth shift in a transistor may be eliminated by once turning on the transistor to cause a current to flow therethrough.

Therefore, in the method of driving the shift register portion 32 in the above-mentioned embodiment, when the forward shift is repeated over a plurality of frames, the trigger signal generating portion 36 may switch the signal VSTB to the H level during a period between the repeated operation to turn on the transistor T9B. On the other hand, when the backward shift is repeated, the trigger signal generating portion 36 may switch the signal VSTF to the H level during a period between the repeated operation to turn on the transistor T9F. This may prevent the potential of the reference point N1 from being lowered during a period of being set to the H level due to a leakage current of the transistor T9F or T9B resulting from a Vth shift. It is to be noted that the period between the repeated operation may be set, in the forward shift operation, in a range after an output pulse is generated in the N-th stage and before a pulse of the forward direction trigger signal VSTF with regard to the next frame is generated, and, in the backward shift operation, in a range after an output pulse is generated in the first stage and before a pulse of the reverse direction trigger signal VSTB with regard to the next frame is generated. For example, the period may be set within a vertical blanking period of image signals written in the pixel circuits 12.

Further, the unit register circuits are not limited to the ones illustrated in FIGS. 3 to 7, and may have other circuit structures which include the forward direction set terminal NSF and the reverse direction set terminal NSB, the forward direction reset terminal NRF and the reverse direction reset terminal NRB, a set circuit for setting the potential of a reference point to a first potential when a set signal is input to the terminal NSF or the terminal NSB, a reset circuit for setting the potential of the reference point to a second potential when a reset signal is input to the terminal NRF or the terminal NRB, and an output circuit for outputting a pulse to an output signal in synchronization with a clock pulse which is input to the unit register circuit with the reference point being at the first potential. For example, a unit register circuit 60 in a third embodiment described below is an example of such a circuit structure. Further, when the above-mentioned condition for controlling the transistor T3 by a clock signal common between the forward shift and the backward shift (βf+βb=n) is not satisfied, a circuit structure may be adopted in which a control signal to be applied to the gate of the transistor T3 is switched between one for the forward shift and one for the backward shift, and this is one modification of the unit register circuit.

It is to be noted that, in the above-mentioned embodiment, a case is described in which a pulse of a clock signal which drives a gate line driving circuit 14 on one side does not overlap another pulse in an adjacent phase. However, the present invention may also be applied to a case in which a pulse of a clock signal overlaps another pulse in an adjacent phase. In that case, it is necessary that a set signal to the terminal NSF or NSB and a reset signal to the terminal NRF or NRB do not overlap when being input. More specifically, it is necessary that an output pulse in the (k−βb)th stage and an output pulse in the (k−αf)th stage do not overlap each other and an output pulse in the (k+αb)th stage and an output pulse in the (k+βf)th stage do not overlap each other. By this, the following condition of αf, αb, βf, and βb is obtained:

$$\alpha f + \kappa \leq \beta b < n \text{ and } \alpha b + \kappa \leq \beta f < n,$$

where κ is the width of a clock pulse (κ≥1) when, for example, the phase difference between the clock signals Vj and V(j+1) is 1.

A case in which an n-channel transistor is used as a transistor that forms the bidirectional shift register 30 according to the present invention is described above, but the transistor may be a p-channel one. Further, the transistor may be TFT or may be MOSFET. A semiconductor layer which forms the transistor basically may be any one of monocrystalline silicon, amorphous silicon (a-Si), and polycrystalline silicon (poly-Si), and may also be an oxide semiconductor such as indium gallium zinc oxide (IGZO).

[Second Embodiment]

In the following, like reference numerals are used to denote members similar to those in the above-mentioned first embodiment and description thereof is omitted for the sake of simplicity of description.

Figure 10:
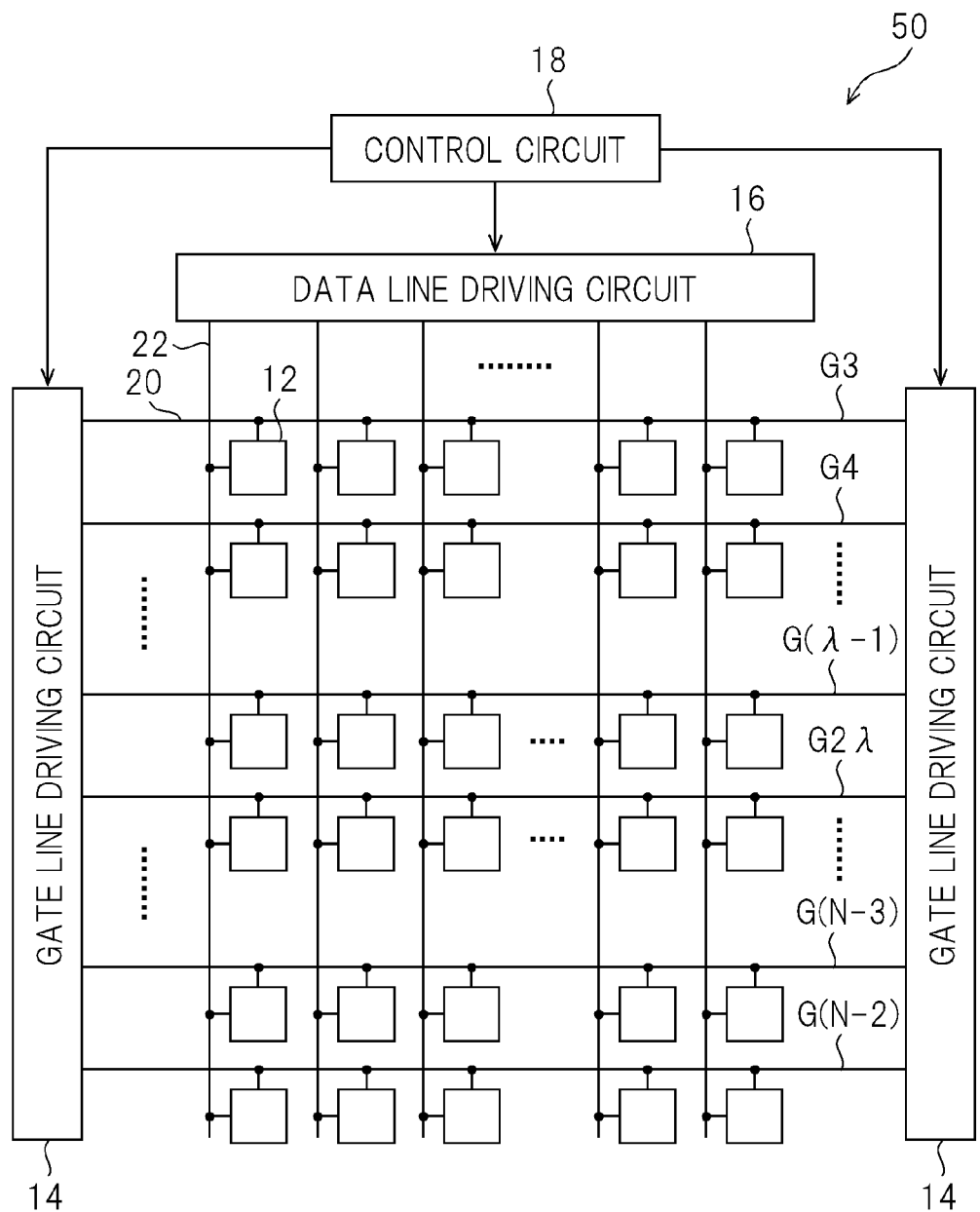
FIG. 10 is a schematic diagram illustrating a structure of an image display device according to a second embodiment.

FIG. 10 is a schematic diagram illustrating a structure of an image display device 50 according to a second embodiment. Similarly to the image display device 10, the image display device 50 is, for example, a liquid crystal display. The image display device 50 includes a plurality of pixel circuits 12, gate line driving circuits 14, a data line driving circuit 16, and a control circuit 18.

The gate line driving circuits 14 on the right and on the left have the same circuit structure and simultaneously operate in synchronization with each other under the control of the control circuit 18 to supply a gate signal to all the gate signal lines 20 no matter which of an odd-numbered line and an even-numbered line the gate signal line 20 is. In other words, the gate line driving circuits 14 on the right and on the left apply the same drive signal from both sides of the gate signal line 20. By applying a pulse from both sides in this way, effects of deterioration of the waveform of the drive signal due to CR of the gate signal line 20 may be reduced. The gate line driving circuits 14 drive the gate signal lines 20 at timings shifted by 1H.

Figure 11:
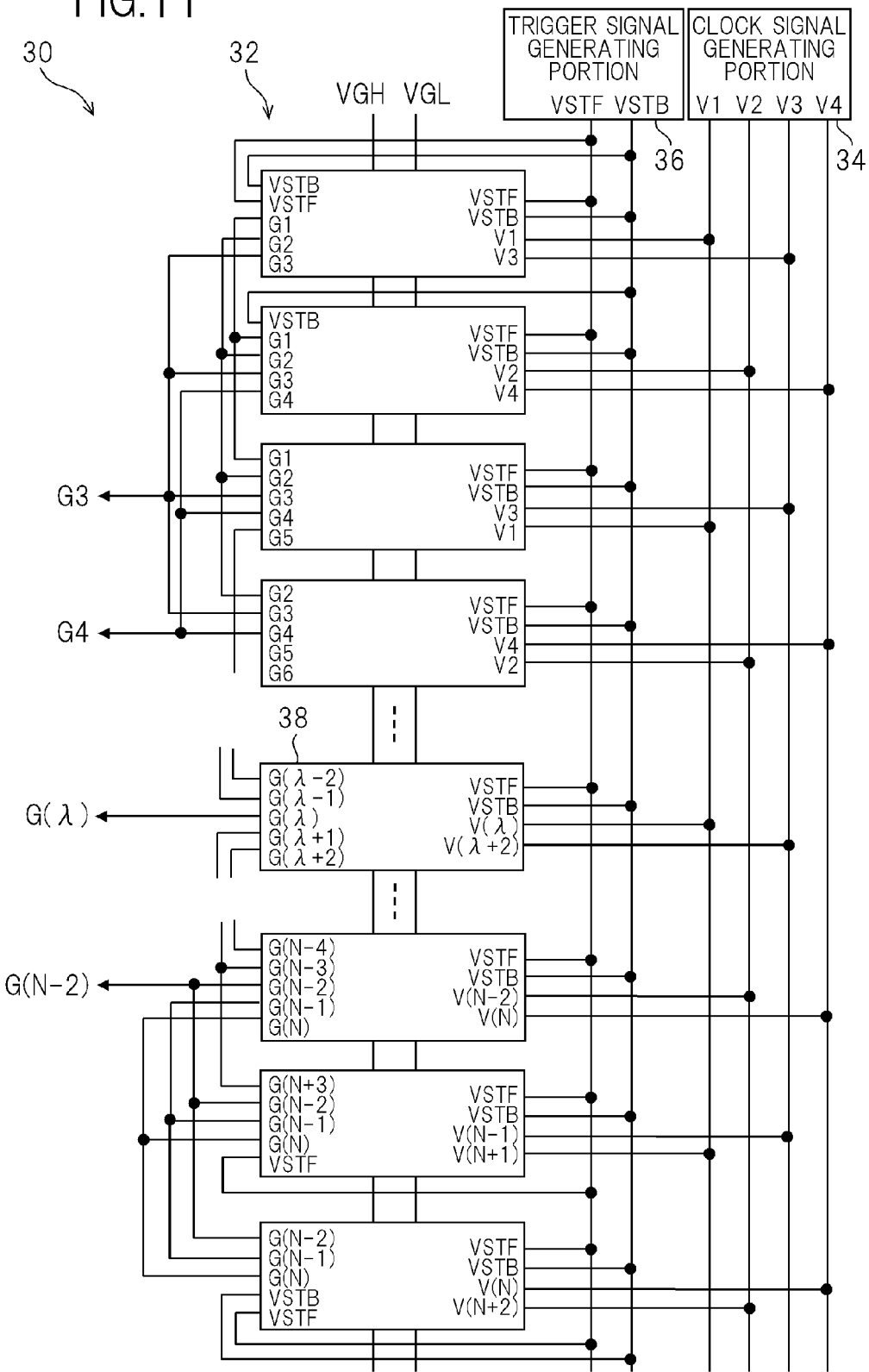
FIG. 11 is a schematic diagram illustrating a structure of a bidirectional shift register according to the second embodiment.

FIG. 11 is a schematic diagram illustrating a structure of a bidirectional shift register 30 used for scanning the gate signal lines 20 of the image display device 50. N unit register circuits 38 having the same structure as in the first embodiment are cascaded in the shift register portion 32. The number of the main stages is N−4 and two dummy stages are provided at the top before the main stages and two dummy stages are provided at the bottom after the main stages. The bidirectional shift register 30 has a circuit structure which is basically the same as that described in the first embodiment with reference to FIG. 2. The difference is that output terminals in the stages of the shift register portion 32 are connected not to every other gate signal lines 20 but to all the gate signal lines 20. Correspondingly to this, while, in the first embodiment, an output signal in the k-th stage (k is a natural number which satisfies $1 \leq k \leq N$) of the gate line driving circuit 14R is denoted as G(2k−1) and an output signal in the k-th stage of the gate line driving circuit 14L is denoted as G(2k), an output signal in the k-th stage of the gate line driving circuits 14 of the image display device 50 is denoted as Gk. G1, G2, G(N−1), and GN which are outputs of the dummy stages are not output to the gate signal lines 20, and an output Gλ in the λth stage (λ is a natural number which satisfies $3 \leq \lambda \leq N-2$) which is a main stage is output to a gate signal line 20.

Operation of the bidirectional shift register 30 in this embodiment is basically similar to that of the gate line driving circuit 14R of the first embodiment described with reference to FIGS. 8 and 9. However, while, in the first embodiment, the width of a clock pulse is 2H, the width of a clock pulse is 1H in this embodiment. With this, the gate line driving circuits 14 switch terminals which output a pulse in sequence in the forward direction or in the reverse direction every 1H period to drive the gate signal lines 20 in sequence.

It is to be noted that various kinds of variations in structure described in the first embodiment may also be adopted in the bidirectional shift register according to this embodiment.

[Third Embodiment]

In the following, like reference numerals are used to denote members similar to those in the above-mentioned first embodiment and description thereof is omitted for the sake of simplicity of description.

A schematic structure of an image display device 10 according to a third embodiment is similar to that of the first embodiment described with reference to FIG. 1. The gate line driving circuit 14R drives odd-numbered lines while the gate line driving circuit 14L drives even-numbered lines.

Figure 12:
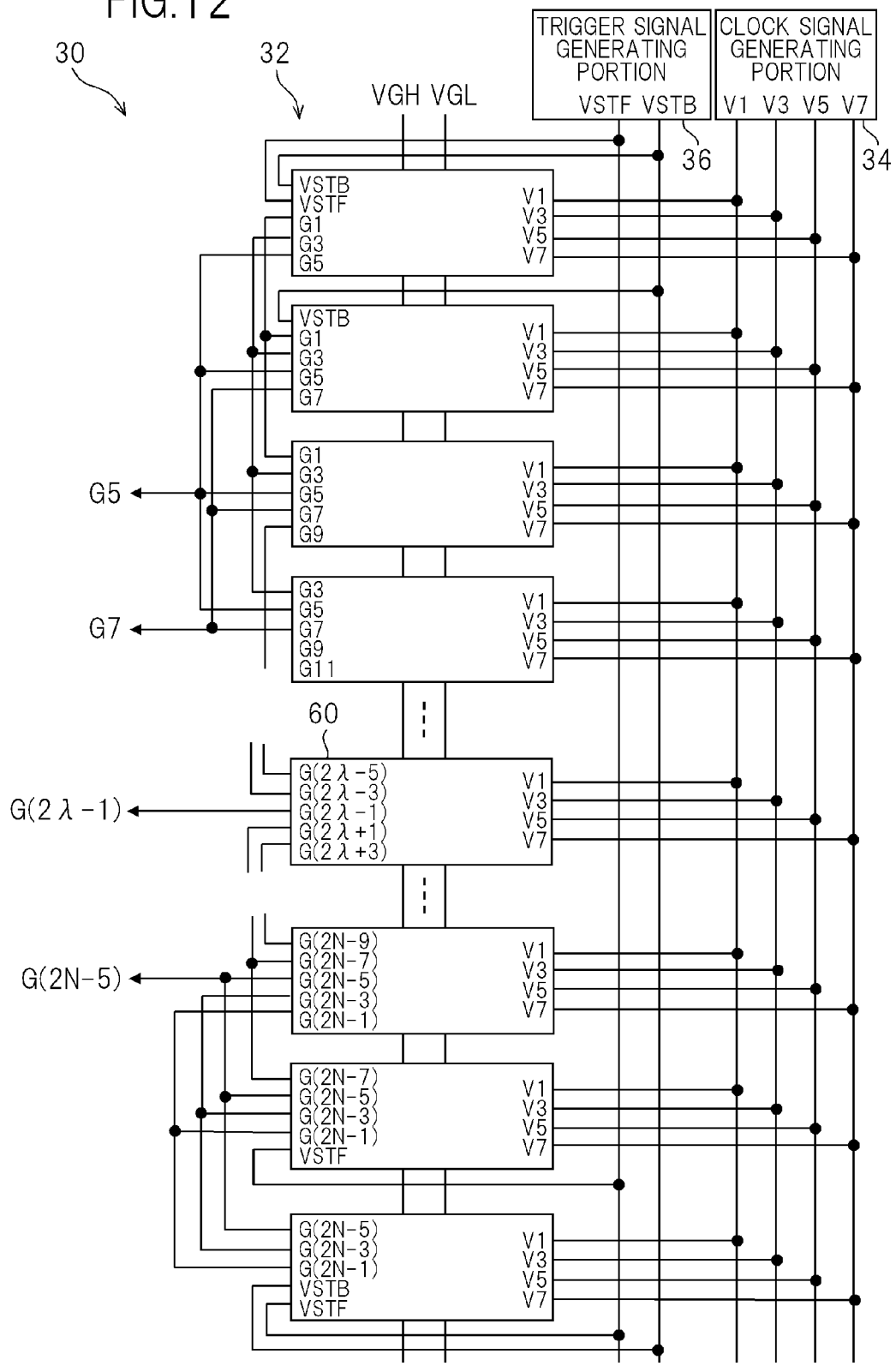
FIG. 12 is a schematic diagram illustrating a structure of a bidirectional shift register according to a third embodiment.

FIG. 12 illustrates by way of example a structure of a portion which relates to the shift register portion 32 provided in the gate line driving circuit 14R on the right side. N unit register circuits 60 are cascaded in the shift register portion 32. The number of the main stages is N−4 and two dummy stages are provided at the top before the main stages and two dummy stages are provided at the bottom after the main stages. As described below, the unit register circuit 60 in this embodiment has a circuit structure which is different from that of the unit register circuit 38 in the first embodiment in that a clock signal and a control signal to be input to each of the stages are different from those in the first embodiment illustrated in FIG. 2. However, outputs of the stages and the way of cascading the stages are basically similar to those in the first embodiment.

The clock signal generating portion 34 is similar to that in the first embodiment. The eight-phase clock signals V1 to V8 are divided into two sets of four-phase clock signals. Among them, the group of V1, V3, V5, and V7 is supplied to the gate line driving circuit 14R. All of V1, V3, V5, and V7 are input to each of the unit register circuits 60. One clock signal among them which is used as the output control clock signal is determined according to the location of the unit register circuit 60 in the shift register portion 32.

Figure 13:
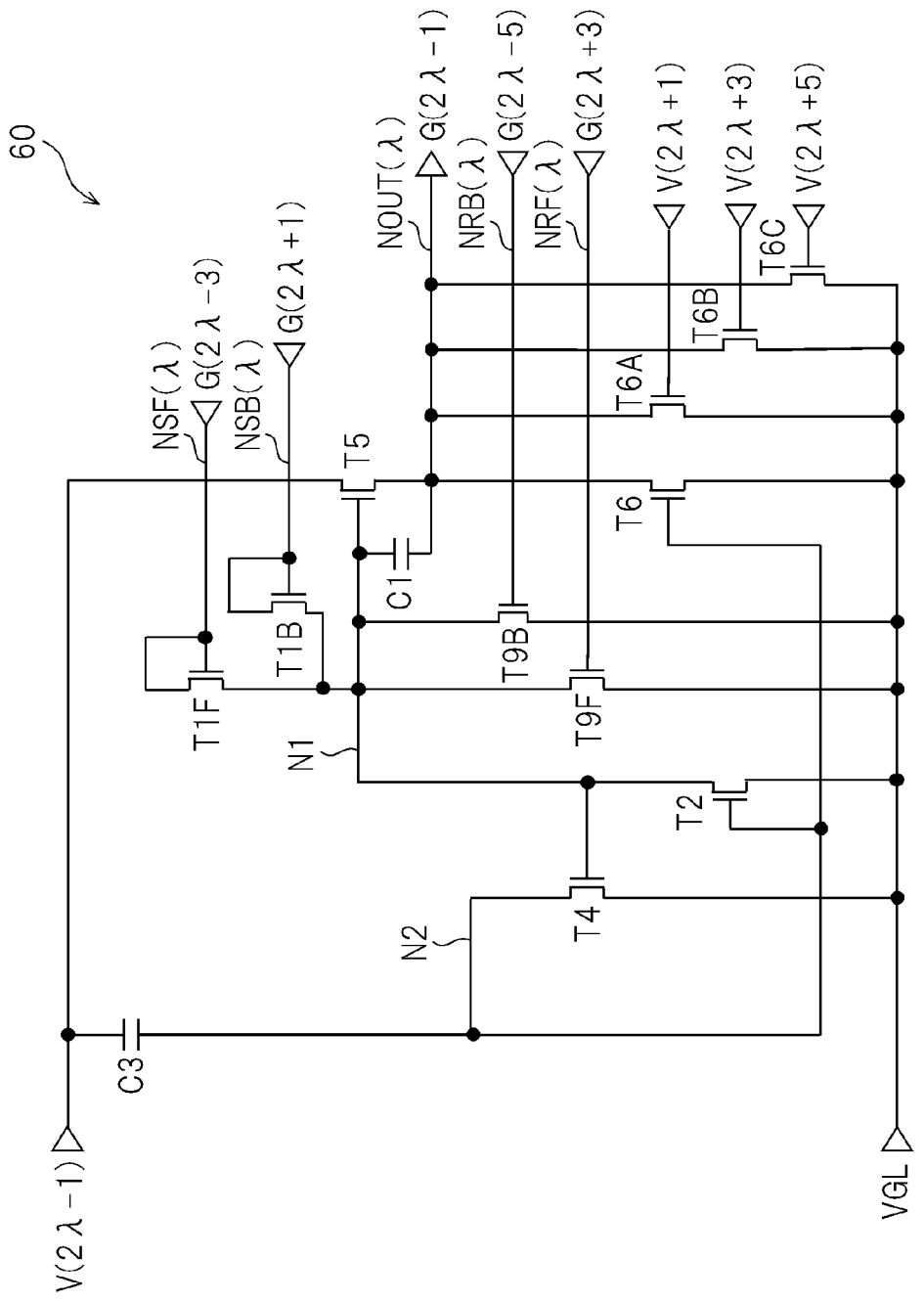
FIG. 13 is a schematic circuit diagram of a unit register circuit of the bidirectional shift register according to the third embodiment.
Figure 14:
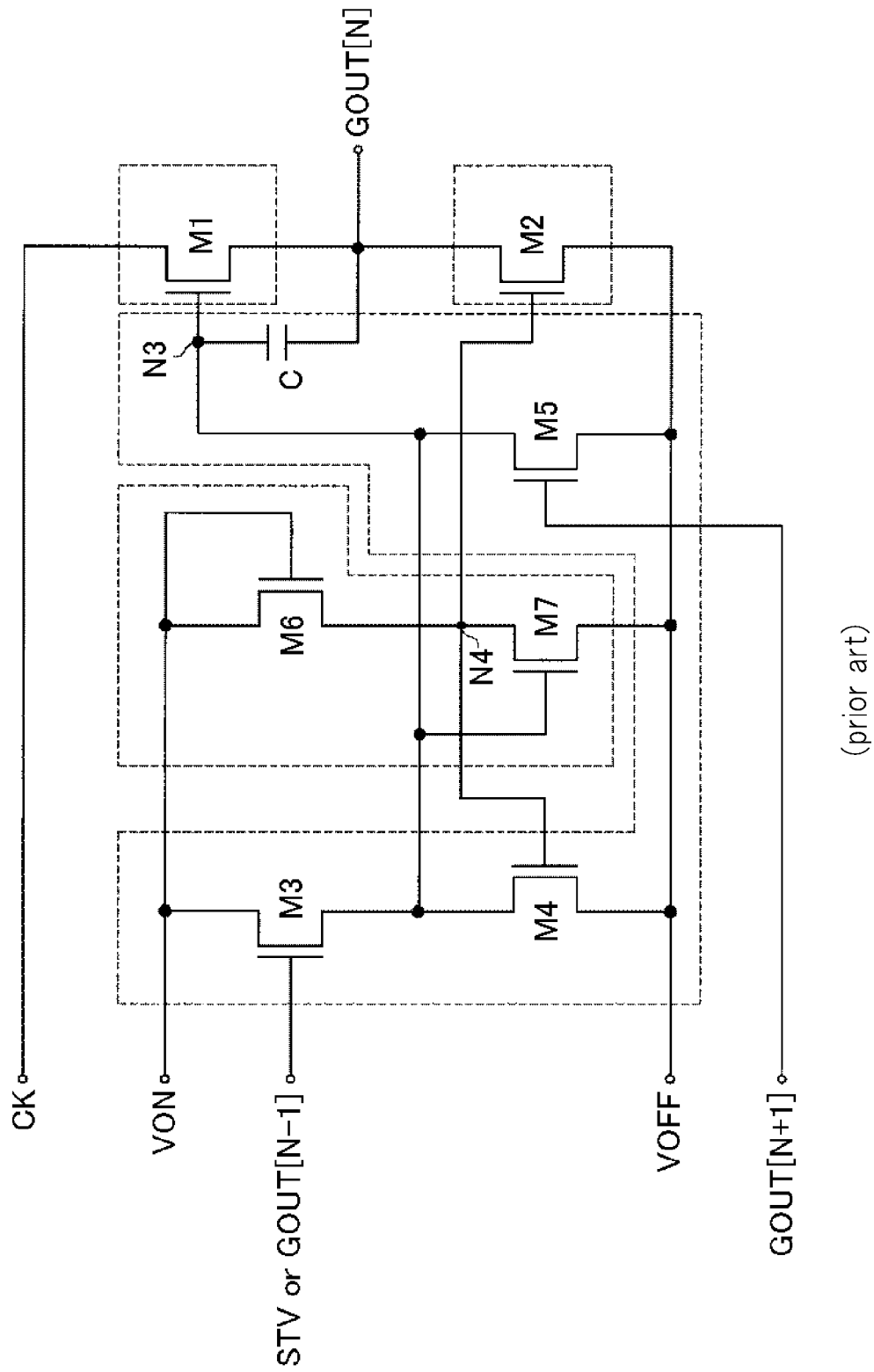
FIG. 14 is a circuit diagram illustrating a structure of a conventional unit register circuit.
Figure 15:
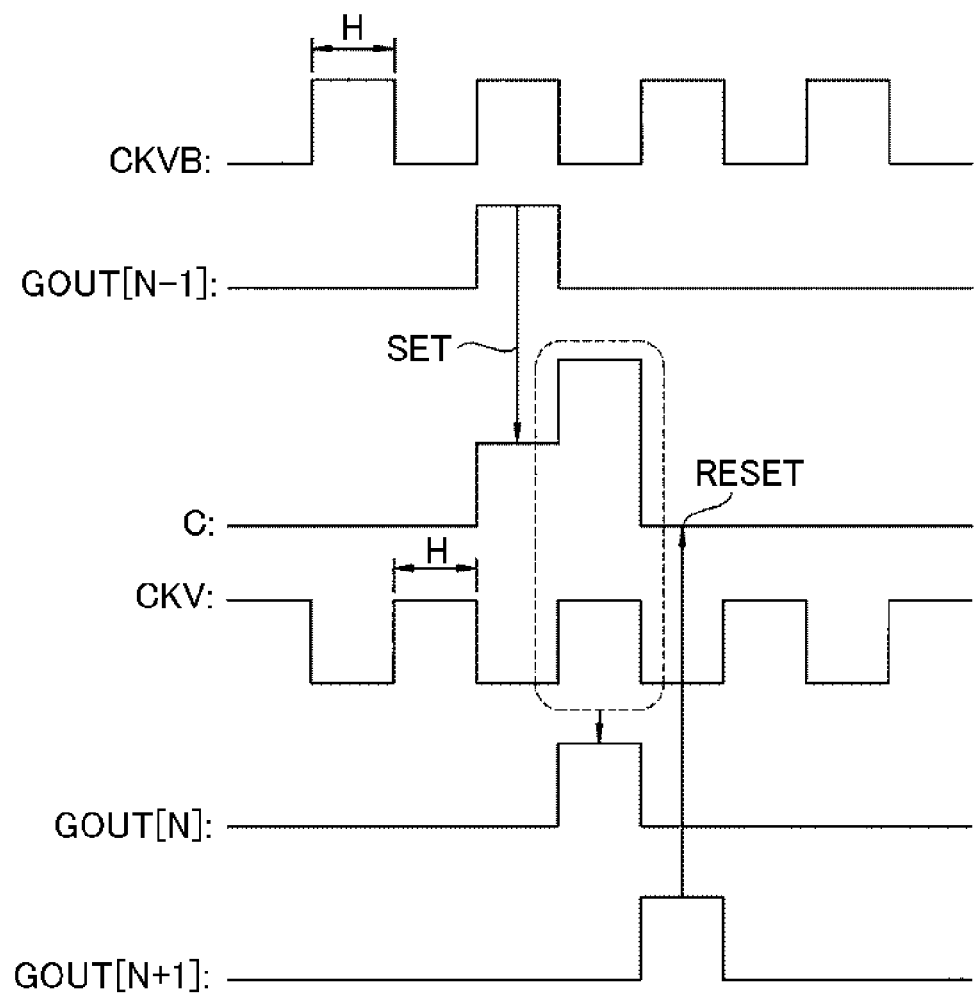
FIG. 15 is a signal waveform chart illustrating operation of the conventional unit register circuit.

FIG. 13 is a schematic circuit diagram of the unit register circuit 60. FIG. 13 illustrates the unit register circuit 60 in the λth stage (main stage). A basic structure of the unit register circuit 60 in the k-th stage ($1 \leq k \leq N$) is described with reference to the unit register circuit 60 in a main stage (λth stage), and then, a structure of the unit register circuit 60 in the dummy stages (k=1, 2, N−1, and N) is described mainly with reference to points different from those of the basic structure.

The unit register circuit 60 in the k-th stage includes NMOS transistors T1F, T1B, T2, T4 to T6, T6A, T6B, T6C, T9F, and T9B and capacitors C1 and C3.

The unit register circuit 60 in the k-th stage has an output terminal NOUT(k) for outputting a pulse G(2k−1) of its own stage. The unit register circuit 60 in the k-th stage further has, as terminals to which a pulse or a trigger signal in another stage is input, a forward direction set terminal NSF(k), a reverse direction set terminal NSB(k), a forward direction reset terminal NRF(k), and a reverse direction reset terminal NRB(k). An output signal G(2λ−3) is input to a terminal NSF(λ) in a main stage from a (λ−1)th stage, an output signal G(2λ+1) is input to a terminal NSB(λ) from a (λ+1)th stage, an output signal G(2λ+3) is input to a terminal NRF(λ) from a (λ+2)th stage, and an output signal G(2λ−5) is input to a terminal NRB(λ) from a (λ−2)th stage. Some of the input terminals of the dummy stages do not have corresponding output signals in other stages. If so, a trigger signal is input to such a terminal. The dummy stages are to be described more specifically below.

Further, V(2k−1), V(2k+1), V(2k+3), and V(2k+5) are input to the unit register circuit 60 in the k-th stage from the clock signal generating portion 34. Further, to the unit register circuits 60, a voltage at the H level is supplied from a power supply VGH and a voltage at the L level is supplied from a power supply VGL.

A drain of the output transistor T5 is connected to a signal line of the clock signal V(2k−1) and a source of the output transistor T5 is connected to the output terminal NOUT(k), and the conduction of the transistor T5 is controlled according to the potential of a reference point N1 connected to a gate of the transistor T5. The capacitor C1 is connected between the gate and the source of the transistor T5. The transistor T5 and the capacitor C1 function as an output circuit which outputs the output pulse G(2k−1) of its own stage in synchronization with the clock pulse V(2k−1) with the reference point being at the H level.

Drains of the transistors T6, T6A, T6B, and T6C are connected to the output terminal NOUT(k) and sources of the transistors T6, T6A, T6B, and T6C are connected to the power supply VGL. A gate of the transistor T6 is connected to the node N2. A clock signal V(2k+1) is applied to a gate of the transistor T6A. The clock signal V(2k+3) is applied to a gate of the transistor T6B. A clock signal V(2k+5) is applied to a gate of the transistor T6C. When the potential of the node N2, the clock signal V(2k+1), the clock signal V(2k+3), or the clock signal V(2k+5) is at the H level, the output terminal NOUT(k) is connected to the power supply VGL.

The reference point N1 is connected to the terminals NSF (k) and NSB(k) via the diode-connected transistors T1F and T1B, respectively. The transistors T1F and T1B function as a set circuit which sets the reference point N1 at the H level when an output pulse of another stage is input to the terminal NSF(k) or NSB(k).

The transistors T2, T9F, and T9B which are connected between the reference point N1 and the power supply VGL so as to be in parallel to one another function as switch elements which provide continuity/discontinuity between the reference point N1 and the power supply VGL. A gate of the transistor T2 is connected to the node N2, a gate of the transistor T9F is connected to the terminal NRF(k), and a gate of the transistor T9B is connected to the terminal NRB(k). When the potential of the node N2, the terminal NRF(k), or the terminal NRB(k) is at the H level, these transistors set the potential of the reference point N1 to the L level. In particular, the transistors T9F and T9B function as a reset circuit which sets the reference point N1 to the L level when an output pulse of another stage is input to the terminal NRF(k) or NRB(k).

The transistor T4 is connected between the node N2 and the power supply VGL. A gate of the transistor T4 is connected to the reference point N1. Further, the capacitor C3 is connected between the node N2 and an input terminal of the clock signal V(2k−1). The transistor T4 functions as a switch element which provides continuity/discontinuity between the node N2 and the power supply VGL. During a period in which the potential of the reference point N1 is at the H level, the transistor T4 is in the on state, and sets the potential of the node N2 to the L level. On the other hand, during a period in which the potential of the reference point N1 is at the L level, the transistor T4 is in the off state. In this state, when the clock signal V(2k−1) is at the H level, the potential of the node N2 is pulled up to the H level via the capacitor C3.

Next, the unit register circuit 60 in the dummy stages is described. The circuit structure of the unit register circuit 60 in the dummy stages is common to that in the main stages illustrated in FIG. 13. The dummy stages are different from the main stages in that a signal from the trigger signal generating portion 36 is input to some of the terminals NSF, NSB, NRF, and NRB thereof. The different point is similar to that in the first embodiment. More specifically, the forward direction trigger signal VSTF is input to the terminal NSF in the first stage, and the reverse direction trigger signal VSTB is input to the terminal NSB in the N-th stage. Further, the forward direction trigger signal VSTF, for example, is input to the terminal NRF in the (N−1)th and N-th stages, and the reverse direction trigger signal VSTB, for example, is input to the terminal NRB in the first and second stages.

Further, as described in the first embodiment, it is preferred that the size of the output transistors T5 in the dummy stages be made smaller than that in the main stages.

In the above, the structure of the gate line driving circuits 14 is described taking as an example the gate line driving circuit 14R for driving the odd-numbered gate signal lines 20. The structure of the gate line driving circuit 14L for driving the even-numbered gate signal lines 20 in this embodiment is similar to that of the gate line driving circuit 14R on the right side. In this regard, this embodiment is similar to the first embodiment, and thus, the description thereof is omitted.

Next, operation of the bidirectional shift register 30 is described. Timing diagrams illustrating waveforms of various signals in the forward shift operation and in the backward shift operation in this embodiment are the same as FIGS. 8 and 9, respectively, which are referred to in the first embodiment.

The forward shift starts by, at the head of image signals for one frame, generation of a pulse of the forward direction trigger signal by the trigger signal generating portion 36 (at the times t0 and t1 in FIG. 8). As described above, the clock signal generating portion 34 generates, in the forward shift operation, pulses in sequence in the forward direction.

Here, first, forward shift operation of the unit register circuit 60 in a main stage (λth stage) in the gate line driving circuit 14R is described.

Before the operation in the λth stage, the first to (λ−1)th stages are operated in sequence to output pulses having a width of 2H with a phase difference of 2H therebetween. When a pulse of the output signal G(2λ−3) in the (λ−1)th stage is input to the terminal NSF(λ) (time t2 in FIG. 8), the reference point N1 is set to a potential (VGH-Vth (T1F)) corresponding to the H level to turn on the transistor T5, and the interterminal voltage of the capacitor C1 is set to the same potential. Here, the transistor T4 is turned on to set the node N2 to the L level. Therefore, the transistors T2 and T6 are in the off state.

At the time t3 after 2H from the time t2, a pulse of the output control clock signal V(2λ−1) is input to the drain of the transistor T5. The pulse of the clock signal V(2λ−1) pulls up the potential of the source of the transistor T5. Then, the potential of the reference point N1 is further pulled up by the bootstrap effect, and the pulse of the clock signal V(2λ−1) becomes a pulse of the signal G(2λ−1) without lowering the potential thereof to be output from the terminal NOUT(λ). The pulse of the signal G(2λ−1) is input to the terminal NSF in the (λ+1)th stage, and sets the reference point N1 in that stage to the H level.

When, at the time t4, the pulse of the output control clock signal V(2λ−1) falls, the pulse of the signal G(2λ−1) also falls. Further, at this timing, a pulse of the clock signal V(2λ+1) turns on the transistor T6A, and thus, the output terminal NOUT(λ) is connected to the power supply VGL and the output signal G(2λ−1) is at the L level. On the other hand, the potential of the reference point N1 is held at the H level (subsequent set period).

At the time t4, the (λ+1)th stage outputs a pulse of the signal G(2λ+1) in synchronization with the pulse of the clock signal V(2λ+1). In this way, each of the stages outputs a pulse of its own with a delay of 2H from the output of a pulse in the preceding stage. The (λ+2)th stage which receives the output of the pulse in the (λ+1)th stage outputs a pulse of the signal G(2λ+3) at a time t5 which is delayed by 2H from the time t4.

In the λth stage, when the pulse of the signal G(2λ+3) is input to the terminal NRF at the time t5, the transistor T9F is turned on to reset the reference point N1 to the L level. At the same time, a pulse of a clock signal V(2λ+3) turns on the transistor T6B to hold the output signal G(2λ−1) at the L level. It is to be noted that, in the subsequent 2H period, the transistor T6C is turned on by a pulse of a clock signal V(2λ+5) to hold the output signal G(2λ−1) at the L level.

By the way, a pulse of the output control clock signal V(2k−1) is applied to the drain of the transistor T5 even outside the set period of the reference point N1 (output period of the k-th stage), and the pulse has a function to pull up the potential of the reference point N1 via the gate-drain capacitance Cgd of the transistor T5. The potential fluctuations at the reference point N1 are suppressed by turning on the transistor T2. In a reset period of the reference point N1, the reference point N1 is basically at the L level and the transistor T4 is in the off state. In this state, as described above, the potential of the node N2 is pulled up to the H level according to a pulse of the output control clock signal V(2k−1), and the transistors T2 and T6 are turned on. This fixes the reference point N1 to the L level in the reset period, and the output signal G(2λ−1) is held at the L level.

As described above, a main stage receives an output pulse from the previous stage to cause the reference point N1 to be in the set state, and receives an output pulse from the stage next to the subsequent stage to cause the reference point N1 to be in the reset state. However, the dummy stage as the first stage does not have the previous stage. Therefore, as described above, the first stage has a structure in which a pulse of the forward direction trigger signal VSTF is input to the terminal NSF. The first stage receives a pulse of the signal VSTF which is generated at the time t0 to set the reference point N1 to the H level. Operation in the first stage after this is similar to that in the λth stage described above. Further, the (N−1)th and N-th stages which are dummy stages do not have the stage next to the subsequent stage. Therefore, as described above, the (N−1)th and N-th stages have a structure in which a pulse of the forward direction trigger signal VSTF is input to the terminal NRF. The reference point N1 in the (N−1)th and N-th stages is set to the H level at the end of the forward shift operation for one frame, and is then reset to the L level according to a pulse of the signal VSTF which is generated at the start of the subsequent frame.

The forward shift operation of the stages in the gate line driving circuit 14R is described above. The forward shift operation of the stages in the gate line driving circuit 14L is similar to that of the corresponding stages in the gate line driving circuit 14R. However, the stages in the gate line driving circuit 14L operate at a timing 1H behind the corresponding stages in the gate line driving circuit 14R, respectively.

The backward shift starts by, at the head of image signals for one frame, generation of a pulse of the reverse direction trigger signal by the trigger signal generating portion 36 (at the times t0 and t1 in FIG. 9). As described above, the clock signal generating portion 34 generates, in the backward shift operation, pulses in sequence in the reverse direction.

Similarly to the case of the unit register circuits 38 in the first embodiment, in the unit register circuits 60 in the respective stages of the shift register portion 32, the set terminals and the reset terminals are in a symmetrical relationship in structure with respect to the forward shift and the backward shift. Further, similarly to the first embodiment, the top dummy stages and the bottom dummy stages are in a symmetrical relationship in structure with respect to shifts in opposite directions. Therefore, if the control circuit 18 switches the trigger signals and switches the order of generation of the clock pulses, the shift register portion 32 performs the backward shift operation similarly to the forward shift operation.

For example, in the N-th stage in the gate line driving circuit 14R, a pulse of the reverse direction trigger signal VSTB is input to the terminal NSB at the time t1 and the reference point N1 is set to the H level. After that, in synchronization with a pulse of a clock signal V(2N−1) which is generated first, a pulse is generated in an output signal G(2N−1). In this way, pulses are output from the stages in sequence in the opposite order to that in the forward shift operation.

The backward shift operation is described in the above taking as an example the gate line driving circuit 14R. The backward shift operation of each of the stages in the gate line driving circuit 14L is similar to that of the corresponding stage in the gate line driving circuit 14R. However, each of the stages in the gate line driving circuit 14L performs operation with an advance of 1H from the corresponding stage in the gate line driving circuit 14R.

It is to be noted that various kinds of variations in structure described in the first embodiment may also be adopted in the bidirectional shift register according to this embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A bidirectional shift register, comprising:
a shift register portion including unit register circuits cascaded in m stages, where m is an integer which is equal to or larger than 3, for outputting an output pulse $P_k$ in a k-th stage, where k is an integer which satisfies 1≤k≤m, in a shift order which is one of a forward direction and a reverse direction;
a clock signal generating portion for supplying n-phase clock pulses to the respective stages of the shift register portion, where n is an integer which is equal to or larger than 3, in sequence in the forward direction in forward shift operation of the shift register portion and in the reverse direction in backward shift operation; and
a trigger signal generating portion for generating a forward direction trigger signal at the start of the forward shift operation and generating a reverse direction trigger signal at the start of the backward shift operation,
the unit register circuit in a k-th stage including forward and reverse direction set terminals, forward and reverse direction reset terminals, a set circuit for setting a reference point of the unit register circuit to a first potential when a set signal is input to one of the set terminals, a reset circuit for setting the reference point to a second potential when a reset signal is input to one of the reset terminals, and an output circuit for bootstrapping the reference point and outputting the output pulse $P_k$ from an output terminal in synchronization with the n-phase clock pulse which is input to the unit register circuit with the reference point of the unit register circuit being at the first potential,
where variables given as αf, αb, βf, and βb are natural numbers which satisfy both αf<βb<n and αb<βf<n,
the set circuit in the k-th stage being input the output pulse $P_{k-\alpha f}$ when k>αf and the forward direction trigger signal when k≤αf to the forward direction set terminal as the set signal and being input the output pulse $P_{k+\alpha b}$ when k≤m−αb and the reverse direction trigger signal when k>m−αb to the reverse direction set terminal as the set signal, and
the reset circuit in the k-th stage being input the output pulse $P_{k+\beta f}$, where k≤m−βf, to the forward direction reset terminal as the reset signal after the output pulse $P_k$ ends and being input the output pulse $P_{k-\beta b}$, where k>βb, to the reversed direction reset terminal as the reset signal after the output pulse $P_k$ ends,
the forward direction trigger singnal being input to the forward direction reset terminal in each of (m−βf+1)th to m-th stages as the reset signal, and the reverse direction trigger signal being input to the reverse direction reset terminal in each of first to βb-th stages as the reset signal.

2. The bidirectional shift register according to claim 1, wherein both αf and αb are 1.

3. The bidirectional shift register according to claim 1, wherein:
the unit register circuit in each of (αf+1)th to m-th stages includes a circuit for, when the forward direction trigger signal is input, setting the reference point to the second potential; and
the unit register circuit in each of first to (m−αb)th stages includes a circuit for, when the reverse direction trigger signal is input, setting the reference point to the second potential.

4. The bidirectional shift register according to claim 1, wherein:
each of the unit register circuits includes a first transistor including a gate terminal that is connected to the forward direction reset terminal and a second transistor including a gate terminal that is connected to the reverse direction reset terminal, each of the first transistor and the second transistor being provided between the reference point and a power supply of the second potential and, when the reset signal is applied to the gate terminal of each of the first transistor and the second transistor, being turned on to connect the power supply to the reference point; and
the trigger signal generating portion applies a signal for turning on the second transistor to the reverse direction reset terminal in each of the first to βb-th stages during a period between repetitions of the forward shift operation, and applies a signal for turning on the first transistor to the forward direction reset terminal in each of the (m−βf +1)th to m-th stages during a period between repetitions of the backward shift operation.

5. An image display device, comprising:
a plurality of pixel circuits arranged in matrix correspondingly to a plurality of scanning lines;
a plurality of gate signal lines provided for the plurality of scanning lines, respectively, for supplying a gate signal for controlling writing of image data to the plurality of pixel circuits; and
a gate signal line driving circuit for, using the bidirectional shift register according to claim 1, generating the gate signal to each of the plurality of gate signal lines based on the output pulse which is output from a stage correlated with the gate signal line among the plurality of stages of the shift register portion.

* * * * *